(12) United States Patent
Fukuzumi et al.

(10) Patent No.: US 9,093,156 B2
(45) Date of Patent: Jul. 28, 2015

(54) SHIFT REGISTER MEMORY DEVICE, SHIFT REGISTER, AND DATA STORAGE METHOD

(71) Applicant: KABUSHIKI KAISHA TOSHIBA, Minato-ku (JP)

(72) Inventors: Yoshiaki Fukuzumi, Kanagawa-ken (JP); Hideaki Aochi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 161 days.

(21) Appl. No.: 13/857,672

(22) Filed: Apr. 5, 2013

(65) Prior Publication Data

US 2013/0294138 A1 Nov. 7, 2013

Related U.S. Application Data

(63) Continuation of application No. 13/051,245, filed on Mar. 18, 2011, now Pat. No. 8,437,167.

(30) Foreign Application Priority Data

Apr. 28, 2010 (JP) .................... 2010-103604

(51) Int. Cl.

| G11C 19/08 | (2006.01) |
| G11C 13/00 | (2006.01) |
| G11C 11/14 | (2006.01) |
| G11C 19/02 | (2006.01) |

(52) U.S. Cl.
CPC ............ *G11C 19/0808* (2013.01); *G11C 11/14* (2013.01); *G11C 13/0016* (2013.01); *G11C 19/02* (2013.01); *G11C 2213/71* (2013.01)

(58) Field of Classification Search
CPC ..... G11C 19/0808; G11C 19/02; G11C 11/14; G11C 13/0016; G11C 2213/71
USPC ..................... 365/80, 85, 32, 33, 78
See application file for complete search history.

(56) References Cited

U.S. PATENT DOCUMENTS 6,573,713 B2 * 6/2003 Torok et al. .................. 324/252
6,834,005 B1 12/2004 Parkin
(Continued)

OTHER PUBLICATIONS

Magnetic Domain-Wall Racetrack Memory, Stuart S. P. Parkin, et al, Apr. 11, 2008, vol. 320, SCIENCE, pp. 190-194.
(Continued)

*Primary Examiner* — VanThu Nguyen
(74) *Attorney, Agent, or Firm* — Oblon, McClelland, Maier & Neustadt, L.L.P.

(57) ABSTRACT

A shift register memory device includes a shift register, program/read element, and rotating force application unit. The shift register includes plural rotors arranged along a direction with uniaxial anisotropy. Each rotor has a characteristic direction rotatable around a rotational axis extending in the direction. The program/read element can program data to the shift register by matching the characteristic direction of one of the rotors to one selected from two directions conforming to the uniaxial anisotropy and to read data by detecting the characteristic direction. The rotating force application unit can apply a rotating force to the shift register to urge the characteristic direction to rotate. The rotors are organized into plural pairs of every two adjacent rotors. Respective first and second forces urge the characteristic directions to be opposingly parallel for two rotors of the same pair and for two mutually adjacent rotors of mutually adjacent pairs.

18 Claims, 14 Drawing Sheets

(56) References Cited

U.S. PATENT DOCUMENTS

| | | |
|---|---|---|
| 6,898,132 B2 | 5/2005 | Parkin |
| 6,920,062 B2 | 7/2005 | Parkin |
| 7,031,178 B2 | 4/2006 | Parkin |
| 7,108,797 B2 * | 9/2006 | Chen et al. .................. 216/22 |
| 7,236,368 B2 | 6/2007 | Maxwell et al. |
| 7,416,905 B2 * | 8/2008 | Chen et al. ................... 438/3 |
| 7,667,994 B1 * | 2/2010 | Moriya et al. ................ 365/81 |
| 7,710,770 B2 * | 5/2010 | Cowburn et al. ............. 365/173 |
| 7,872,896 B2 * | 1/2011 | Hung ............................. 365/80 |
| 7,936,597 B2 * | 5/2011 | Clinton et al. ............... 365/173 |
| 8,772,889 B2 * | 7/2014 | Gaidis et al. ................. 257/421 |
| 2010/0128510 A1 | 5/2010 | Cowburn |

OTHER PUBLICATIONS

U.S. Appl. No. 13/935,763, filed Jul. 5, 2013, Fukuzumi, et al.

* cited by examiner

VALUE OF "0"

VALUE OF "1"

THE CASE WHERE MUTUALLY ADJACENT ROTOR PAIRS HAVE THE SAME VALUE

THE CASE WHERE MUTUALLY ADJACENT ROTOR PAIRS HAVE DIFFERENT VALUES

SHIFT REGISTER MEMORY DEVICE, SHIFT REGISTER, AND DATA STORAGE METHOD This application is a continuation of U.S. application Ser. No. 13/051,245 filed Mar. 18, 20100, and is based upon and claims the benefit of priority from the prior Japanese Patent Application No. 2010-103604, filed on Apr. 28, 2010; the entire contents of each of which are incorporated herein by reference.

FIELD

Embodiments described herein relate generally to a shift register memory device, a shift register, and a data storage method.

BACKGROUND

To date, higher integration of memory has progressed by downscaling to reduce the memory cell size. A conventional memory device includes a storage element that stores data, a program/read unit that selects the storage element, programs data, and reads the data, and an interconnect that transmits the data to the storage element; and these are made for each memory cell. Therefore, it is necessary to perform the downscaling of all of the components of the memory cell recited above to increase the memory cell integration; and there has been a limitation on increasing the integration. On the other hand, shift register memory devices have been proposed in which only the storage elements are disposed with high density and the data is shifted through the storage element column to transfer the data to a program/read unit provided in a separate location. However, while it is practically necessary to store not less than 100 positions of data in one storage element column in such a case, unfortunately, it has been exceedingly difficult to synchronously move 100 or more positions of data accurately.

DETAILED DESCRIPTION

Figure 1:
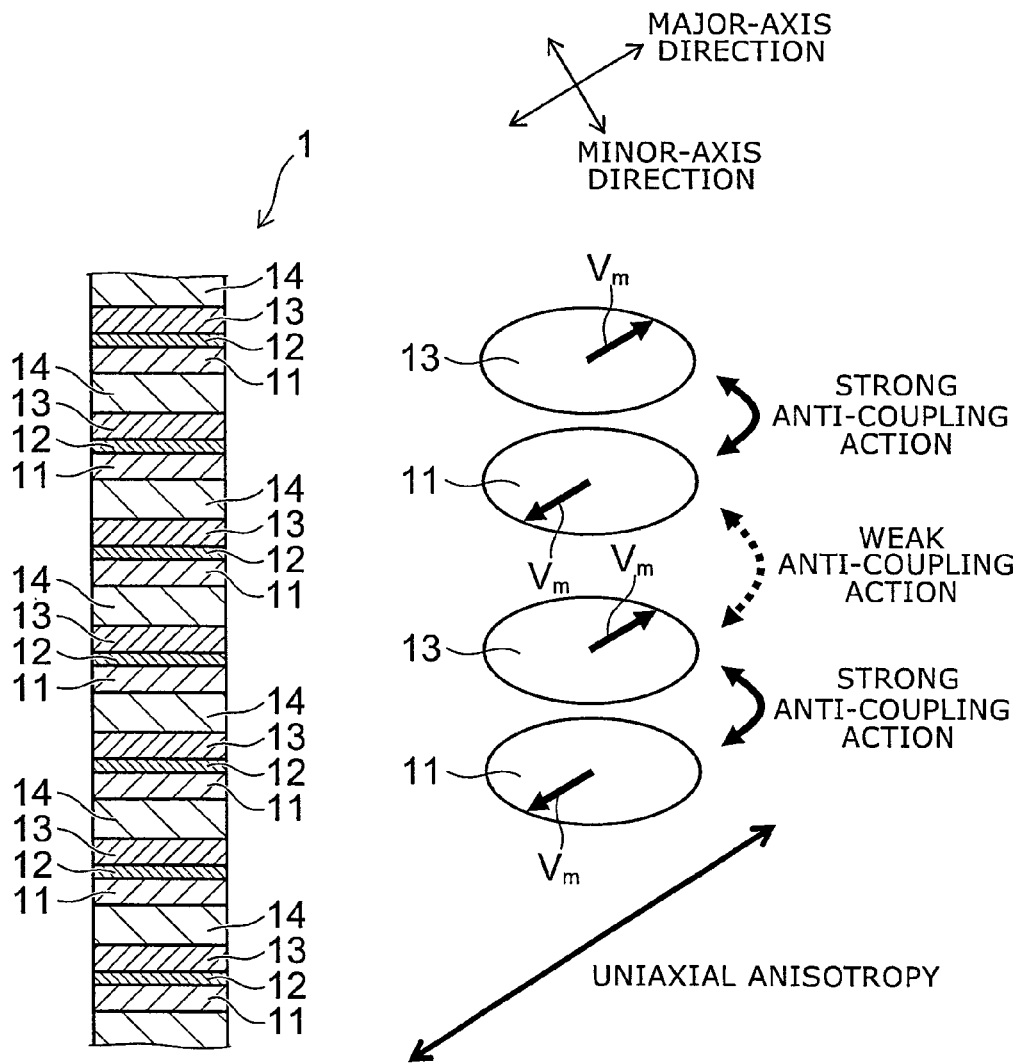
FIG. 1 illustrates a shift register according to a first embodiment.

In general, according to one embodiment, a shift register memory device includes a shift register, a program/read element, and a rotating force application unit. The shift register includes a plurality of rotors arranged along one direction and provided with a uniaxial anisotropy. Each of the plurality of rotors has a characteristic direction rotatable around a rotational axis extending in the one direction. The program/read element is configured to program data to the shift register by causing the characteristic direction of one of the rotors to match one selected from two directions conforming to the uniaxial anisotropy and configured to read the data by detecting the characteristic direction. The rotating force application unit is configured to apply a rotating force to the shift register to urge the characteristic direction to rotate. The plurality of rotors are organized into a plurality of pairs of every two mutually adjacent rotors. A first force acts to urge the characteristic directions to be opposingly parallel for two of the rotors belonging to the same pair. A second force acts to urge the characteristic directions to be opposingly parallel for two mutually adjacent rotors belonging to mutually adjacent pairs.

According to another embodiment, a data storage method is disclosed. The method can include programming data in a shift register including a plurality of rotors arranged along one direction and provided with a uniaxial anisotropy. Each of the plurality of rotors has a characteristic direction rotatable around a rotational axis extending in the one direction. The plurality of rotors are organized into a plurality of pairs of every two mutually adjacent rotors. A first force acts to urge the characteristic directions to be opposingly parallel for two of the rotors belonging to the same pair. A second force acts to urge the characteristic directions to be opposingly parallel for two mutually adjacent rotors belonging to mutually adjacent pairs. The data is programmed to the pair including one of the rotors of the shift register by causing the characteristic direction of the one of the rotors to match one selected from two directions conforming to the uniaxial anisotropy by rotating the characteristic direction of the one of the rotors in one rotation direction. The method can include shifting data in a direction away from the one of the rotors by applying a rotating force to the shift register to urge the characteristic direction to rotate in the one rotation direction. The method can include shifting data in a direction toward the one of the rotors by applying a rotating force to the shift register to urge the characteristic direction to rotate in a direction reverse to the one rotation direction. In addition, the method can include reading the data programmed to the pair including the one of the rotors by detecting the characteristic direction of the one of the rotors. Embodiments of the invention will now be described with reference to the drawings.

First, a first embodiment of the invention will be described.

FIG. 1 illustrates a shift register according to this embodiment.

In the shift register 1 according to this embodiment as illustrated in FIG. 1, a ferromagnet layer 11, a thin ruthenium layer 12, a ferromagnet layer 13, and a thick ruthenium layer 14 are stacked in this order repeatedly. The ferromagnet layers 11 and 13 are made of, for example, a ferromagnet material, e.g., a nickel-iron alloy (a NiFe alloy); and the thickness of each is, for example, 4 nm. The ruthenium layers 12 and 14 are made of ruthenium (Ru); and the thickness of the thick ruthenium layer 14 is thicker than the thickness of the thin ruthenium layer 12. The thickness of the thin ruthenium layer 12 is, for example, 0.8 nm; and the thickness of the thick ruthenium layer 14 is 2.1 nm.

The configuration of the shift register 1 as viewed from the stacking direction of the layers is a configuration extending along one axis, e.g., an ellipse, an oval, a diamond shape, a rectangle, etc. Accordingly, the configuration of the shift register 1 is, for example, an elliptical columnar configuration, an oval columnar configuration, a diamond-shaped columnar configuration, a rectangular columnar configuration, etc., extending in the stacking direction. Hereinbelow, the major-diameter direction of the shift register 1 as viewed from the stacking direction is referred to as the "major-axis direction"; and the minor-diameter direction is referred to as the "minor-axis direction." The stacking direction, the major-axis direction, and the minor-axis direction are mutually orthogonal.

In this embodiment, each of the ferromagnet layers 11 and 13 is taken to be a "rotor"; and a magnetization direction $V_m$ thereof is taken to be a "characteristic direction." In other words, in the shift register 1, multiple rotors are arranged in one column along the stacking direction of the layers. The magnetization direction (the characteristic direction) of each of the ferromagnet layers 11 and 13 can be any direction in the plane, that is, in the plane perpendicular to the stacking direction. In other words, the magnetization direction $V_m$ of each of the ferromagnet layers is rotatable around a rotational axis extending in the stacking direction. More generally speaking, a "rotor" is a component in which the component itself of a property thereof is rotatable on its own axis; and a "characteristic direction" is a direction that represents something of the rotor that rotates.

However, several forces act on the magnetization direction $V_m$ of each of the ferromagnet layers.

First, there exists a force caused by uniaxial anisotropy. "Uniaxial anisotropy" refers to a property in which the energy is a minimum when some vector is oriented in a designated direction (not an orientation) around a rotational axis. Because the shift register 1 has a configuration extending along the major-diameter direction as viewed from the stacking direction, the configurations of the ferromagnet layers 11 and 13 also are configurations extending in the major-axis direction. Thereby, the magnetization directions $V_m$ of the ferromagnet layers 11 and 13 are provided with uniaxial anisotropy (shape magnetic anisotropy) caused by the configuration to be easily oriented in one of the major-axis directions. In other words, the major-axis direction is an easy magnetization direction.

Further, there exists a force due to a strong anti-coupling action. The magnetization direction $V_m$ of the ferromagnet layer 11 and the magnetization direction $V_m$ of the ferromagnet layer 13 are urged to be oriented in mutually opposite directions because an antiferromagnetic coupling state occurs between the mutually adjacent ferromagnet layers 11 and 13 having the thin ruthenium layer 12 interposed therebetween due to the action of the thin ruthenium layer 12. Hereinbelow, this action is referred to as a "strong anti-coupling action" for convenience in the specification. Thereby, a force (a first force) acts to urge the magnetization direction $V_m$ to be opposingly parallel between the mutually adjacent ferromagnet layers 11 and 13 having the thin ruthenium layer 12 interposed therebetween. Hereinbelow, this force is referred to as a "strong force." The pair of mutually adjacent ferromagnet layers 11 and 13 having the thin ruthenium layer 12 interposed therebetween are coupled via the strong anti-coupling action to form a rotor pair. Thereby, the multiple ferromagnet layers 11 and the multiple ferromagnet layers 13 belonging to the shift register 1 are organized into multiple rotor pairs of every mutually adjacent ferromagnet layers 11 and 13 having the thin ruthenium layer 12 interposed therebetween.

Also, there exists a force due to a weak anti-coupling action. Due to the action of the thick ruthenium layer 14, an antiferromagnetic coupling state occurs between the mutually adjacent ferromagnet layers 11 and 13 having the thick ruthenium layer 14 interposed therebetween; and the magnetization direction $V_m$ of the ferromagnet layer 11 and the magnetization direction $V_m$ of the ferromagnet layer 13 are urged to be oriented in mutually opposite directions. Hereinbelow, this action is referred to as a "weak anti-coupling action." Thereby, a force (a second force) acts to urge the magnetization direction to be opposingly parallel between the mutually adjacent ferromagnet layers 11 and 13 having the ruthenium layer 14 interposed therebetween. The second force is weaker than the first force because the ruthenium layer 14 is thicker than the ruthenium layer 12. Hereinbelow, the second force is referred to as a "weak force." The pair of mutually adjacent ferromagnet layers 11 and 13 having the thick ruthenium layer 14 interposed therebetween, i.e., the two mutually adjacent rotors belonging to mutually adjacent rotor pairs, are coupled via the weak anti-coupling action.

The uniaxial anisotropy, the strong anti-coupling action, and the weak anti-coupling action are actions occurring due to the internal configuration of the shift register 1 itself; and these actions themselves are static without time dependency. However, the force acting on the magnetization direction $V_m$ of the individual ferromagnet layers due to these actions, i.e., the force caused by the uniaxial anisotropy, the strong force, and the weak force, changes according to the magnetization direction $V_m$ of each of the ferromagnet layers and the relationship between the magnetization directions $V_m$ of the mutually adjacent ferromagnet layers. In the case where actions other than the uniaxial anisotropy, the strong anti-coupling action, and the weak anti-coupling action do not act, the state in which the energy is the lowest and the stability is the highest is a state in which the magnetization direction $V_m$ of each of the ferromagnet layers is aligned in the major-axis direction and the magnetization directions $V_m$ of the mutually adjacent ferromagnet layers are mutually reverse directions, that is, a state in which the magnetization directions $V_m$ of all of the ferromagnet layers 11 are the same and the magnetization directions $V_m$ of all of the ferromagnet layers 13 are directions reverse to the magnetization directions $V_m$ of the ferromagnet layers 11.

In addition to such internal forces, external forces may be applied to the magnetization direction of each of the ferromagnet layers from outside the shift register 1. External forces may include a rotating force occurring due to a magnetic field being rotated and a force for programming that sets the magnetization direction to one selected from the major-axis directions to program data. Such forces are dynamic forces that change according to the operations of the shift register 1. Such forces are described below.

It is preferred that an intensity of the "weak force" (the second force) is about 0.9 times of an intensity of the "strong force" (the first force). This makes a margin expand in the shift action mentioned later. And even when the intensity of a rotation magnetic field or the magnetization intensity of each rotors varies, the shift action can be stabilized.

A shift register memory device according to this embodiment will now be described.

Figure 2:
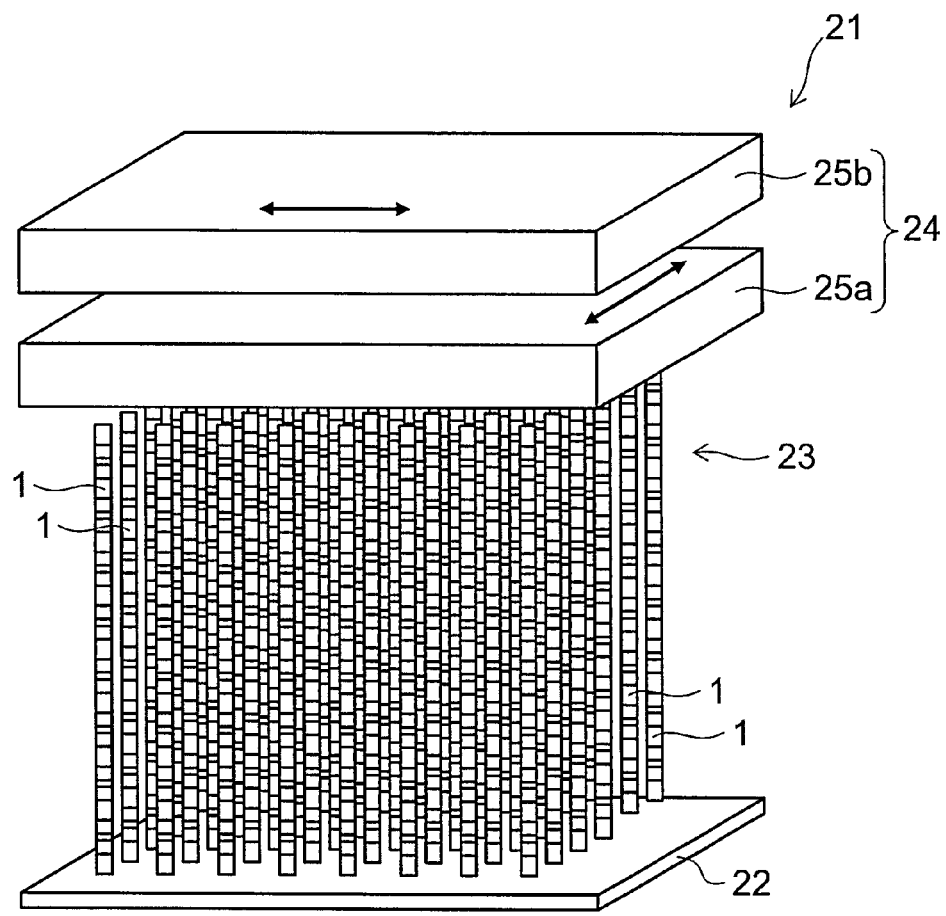
FIG. 2 is a perspective view illustrating a shift register memory device according to the first embodiment.

FIG. 2 is a perspective view illustrating the shift register memory device according to this embodiment.

Figure 3:
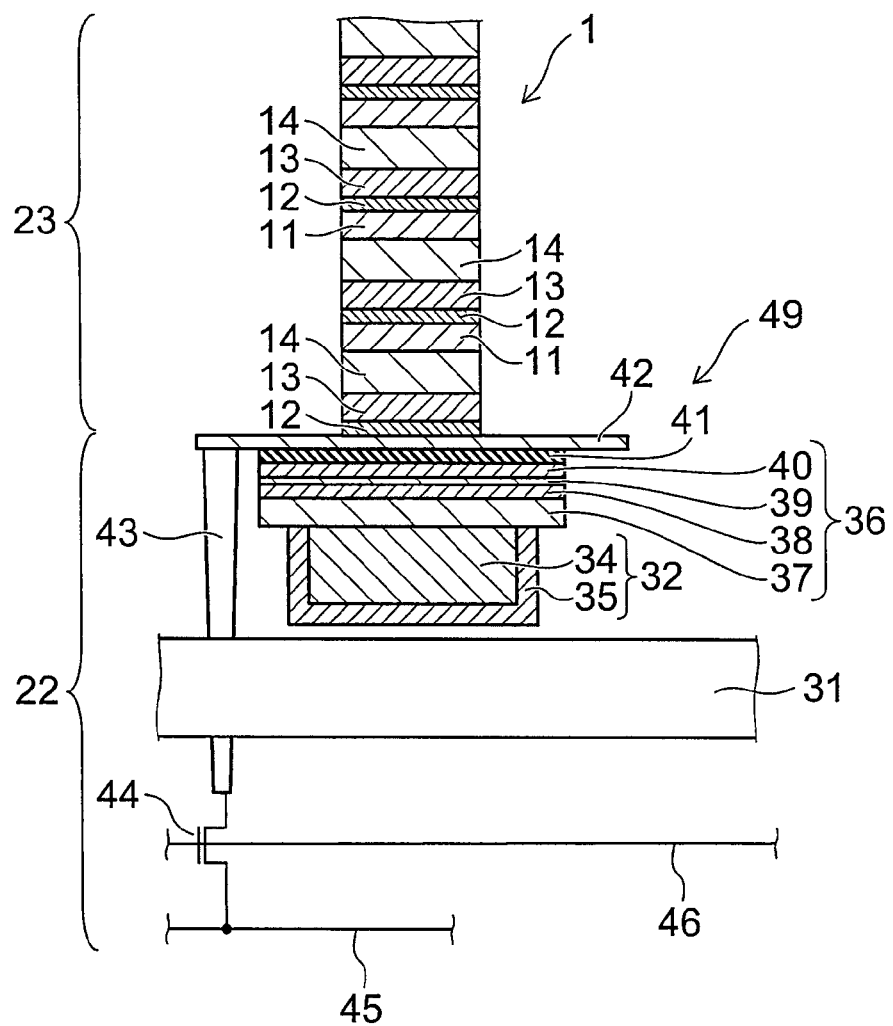
FIG. 3 is a cross-sectional view illustrating a program/read element of the shift register memory device according to the first embodiment.

FIG. 3 is a cross-sectional view illustrating the program/read element of the shift register memory device according to this embodiment.

In the shift register memory device 21 according to this embodiment as illustrated in FIG. 2, a program/read element 22, a storage unit 23, and a rotating force application unit 24 are provided in order from the lower side.

In the storage unit 23, the shift register 1 described above is multiply provided and is arranged in a matrix configuration. Each of the shift registers 1 extends in the vertical direction. In other words, the stacking direction of the shift register 1 matches the vertical direction of the shift register memory device 21. The major-axis directions of the shift registers 1 match each other. In other words, the direction of the uniaxial anisotropy is the same for each of the shift registers 1. Further, the shift registers 1 are isolated from each other. The lower end of each of the shift registers 1 is connected to the program/read element 22.

The rotating force application unit 24 includes interconnects 25a and 25b extending in mutually orthogonal directions. The interconnect 25a extends in the major-axis direction of the shift register 1; and the interconnect 25b extends in the minor-axis direction of the shift register 1. By providing current to the interconnects 25a and 25b as described below, a magnetic field is applied to the shift registers 1 of the storage unit 23 to apply a rotating force to the magnetization direction of each of the rotors of the shift registers 1. For example, the interconnect 25a is provided below the interconnect 25b, is not connected to the shift register 1, and is not connected to the interconnect 25b. The rotating force application unit 24 is commonly provided for the multiple shift registers 1 belonging to the storage unit 23.

In the program/read element 22 as illustrated in FIG. 3, a program word line 31 is provided; and a bit line 32 is provided thereon. The program word line 31 and the bit line 32 are mutually orthogonal. For example, the program word line 31 extends in the major-axis direction of the shift register 1; and the bit line 32 extends in the minor-axis direction. Each of the program word line 31 and the bit line 32 has a yoke structure in which a ferromagnet layer 35 made of a ferromagnet material such as an iron-nickel alloy is provided on the lower face and on the side faces of an interconnect main body 34 made of a low-resistance material such as copper (Cu) or tungsten (W). In other words, in the program word line 31 and the bit line 32, the ferromagnet layer 35 has a C-shaped configuration in cross sections perpendicular to the directions in which these interconnects extend.

A reference layer 36 is provided on the bit line 32 and connected to the bit line 32. In the reference layer 36, a platinum-manganese (PtMn) alloy layer 37, an iron-nickel (NiFe) alloy layer 38, a ruthenium (Ru) layer 39, and an iron-nickel (NiFe) alloy layer 40 are stacked in order from below, i.e., from the bit line 32 side. The lower face of the platinum-manganese alloy layer 37 contacts the upper face of the bit line 32. A tunneling barrier film 41 made of, for example, magnesium oxide (MgO) is provided on the reference layer 36; and a lowermost-end ferromagnet layer 42 made of a ferromagnet material such as, for example, an iron-nickel alloy is provided thereon. The lowermost-end ferromagnet layer 42 contacts the thin ruthenium layer 12 which is the lowermost layer of the shift register 1. Thereby, although the lowermost-end ferromagnet layer 42 functions as the ferromagnet layer of the lowermost layer of the shift register 1, the surface area thereof is greater than the surface area of each of the ferromagnet layers provided in the shift register 1. Also, the reference layer 36 and the tunneling barrier film 41 are larger than the shift register 1 and smaller than the lowermost-end ferromagnet layer 42 as viewed from above. The lowermost-end ferromagnet layer 42 is connected to one terminal of a selection transistor 44 by means of a via 43; and one other terminal of the selection transistor 44 is connected to a source line 45. A read-out word line 46 is connected to the gate of the selection transistor 44. The via 43 is not connected to the program word line 31. The bit line 32 and the source line 45 are connected to a sense circuit (not illustrated).

Of each of the components included in the program/read element 22 described above, a program/read unit 49, which includes the reference layer 36, the tunneling barrier film 41, the lowermost-end ferromagnet layer 42, the via 43, and the selection transistor 44, is provided for every shift register 1. On the other hand, the program word line 31, the bit line 32, the source line 45, and the read-out word line 46 are provided for each of the multiple shift registers 1.

Operations of the shift register memory device 21 according to this embodiment formed as described above, that is, a method for using the shift register 1 according to this embodiment, that is, a data storage method according to this embodiment, will now be described.

Figure 4A:
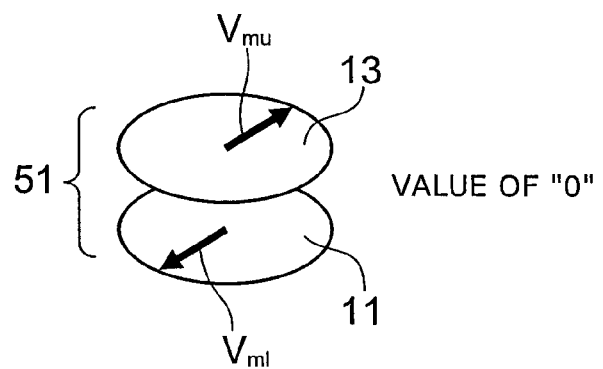
FIGS. 4A and 4B illustrate states that one rotor pair may have in the first embodiment.
Figure 4B:
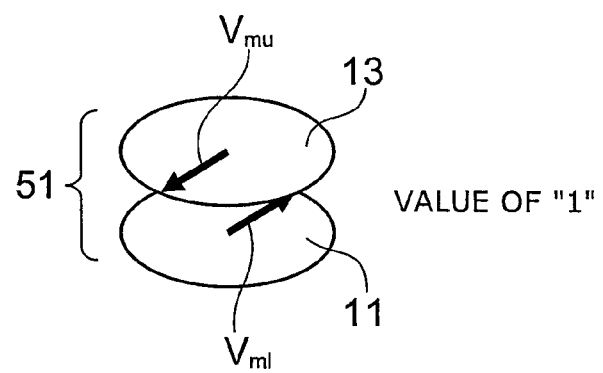

FIGS. 4A and 4B illustrate states that one rotor pair may have in this embodiment.

Figure 5A:
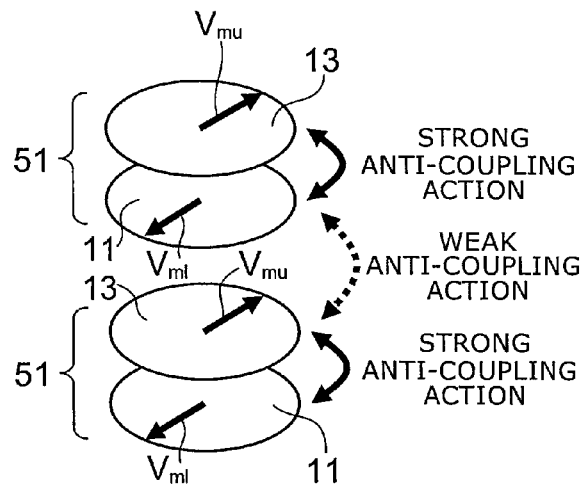
FIG. 5A illustrates the case where the same data is stored in mutually adjacent rotor pairs and FIG. 5B illustrates the case where mutually different data is stored in the mutually adjacent rotor pairs.
Figure 5B:
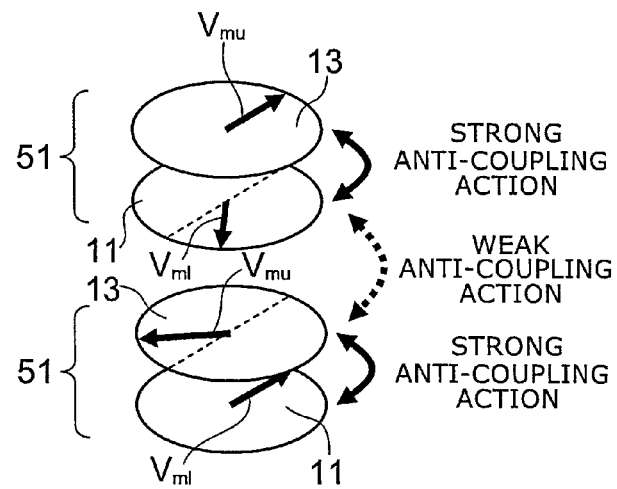

FIG. 5A illustrates the case where the same data is stored in mutually adjacent rotor pairs; and FIG. 5B illustrates the case where mutually different data is stored in the mutually adjacent rotor pairs.

Figure 6:
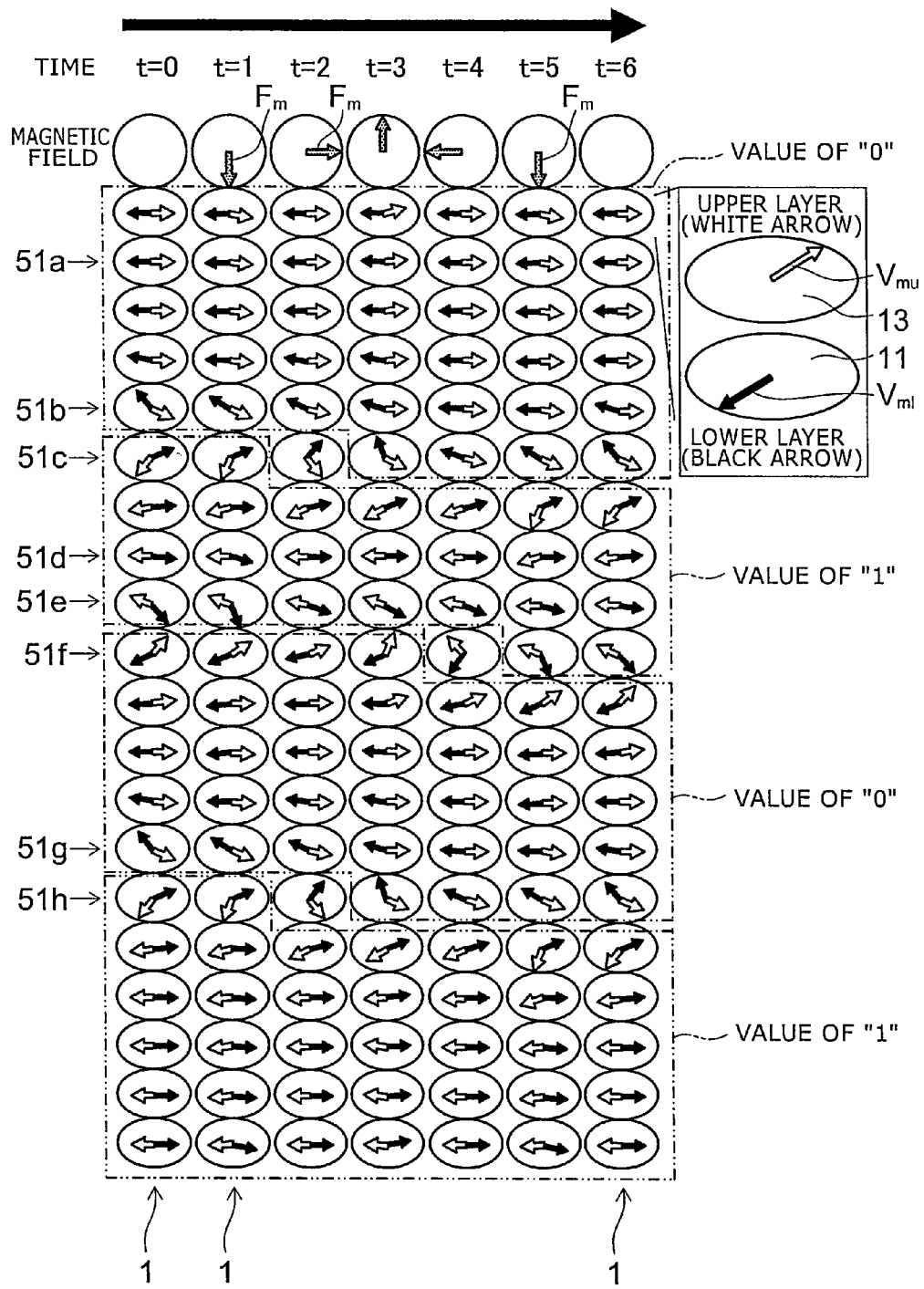
FIG. 6 illustrates a data shift method of the first embodiment.

FIG. 6 illustrates the data shift method of this embodiment.

Figure 7:
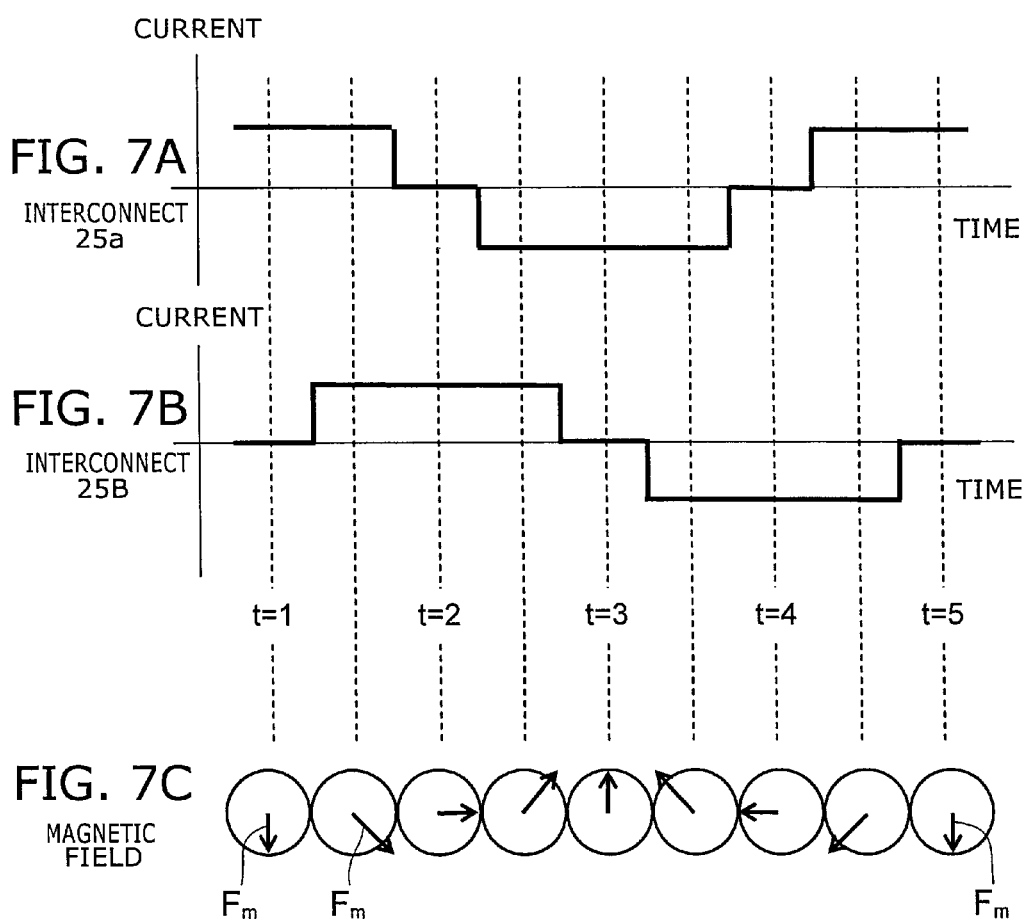
FIGS. 7A and 7B are graphs illustrating operations of a rotating force application unit in which the horizontal axis is the time and the vertical axis is the current flowing through the interconnects and FIG. 7C illustrates the direction of the magnetic field applied to the shift register.

FIGS. 7A and 7B are graphs illustrating operations of the rotating force application unit in which the horizontal axis is the time and the vertical axis is the current flowing through the interconnects; and FIG. 7C illustrates the direction of the magnetic field applied to the shift register.

First, the static states will be described.

In this embodiment as illustrated in FIGS. 4A and 4B, the mutually adjacent ferromagnet layers 11 and 13 having the thin ruthenium layer 12 interposed therebetween are included in one rotor pair 51; and the rotor pairs 51 are arranged in one column along the stacking direction. At this time, the characteristic directions of the two rotors belonging to one rotor pair 51, i.e., the magnetization direction of the ferromagnet layer 11 and the magnetization direction of the ferromagnet layer 13, are oriented in mutually reverse directions due to the urging of the strong anti-coupling action. Also, the magnetization direction of each of the ferromagnet layers is urged to be oriented in the major-axis direction due to the urging of the uniaxial anisotropy. Thereby, the one rotor pair 51 can have two states. In other words, the rotor pair 51 can have the two states of a first state as illustrated in FIG. 4A in which a magnetization direction $V_{mu}$ of the ferromagnet layer 13, i.e., the rotor of the upper side, is on the 3 o'clock-direction side and a magnetization direction $V_{ml}$ of the ferromagnet layer 11, i.e., the rotor of the lower side, is on the 9 o'clock-direction side and a second state as illustrated in FIG. 4B in which the magnetization direction $V_{mu}$ of the rotor of the upper side (the ferromagnet layer 13) is on the 9 o'clock-direction side and the magnetization direction $V_{ml}$ of the rotor of the lower side (the ferromagnet layer 11) is on the 3 o'clock-direction side, where one of two mutually reverse directions along the major-axis direction is notated as the "3 o'clock direction" when represented as a clock face and the other of the two mutually reverse directions along the major-axis direction is notated as the "9 o'clock direction."

Accordingly, data having a value of "0" or "1" is storable in one rotor pair 51. The "3 o'clock-direction side" refers to the range from 12 o'clock to 6 o'clock including the 3 o'clock direction; and the "9 o'clock-direction side" refers to the range from 6 o'clock to 12 o'clock including the 9 o'clock direction. FIGS. 4A and 4B illustrate an example in which the first state described above is taken as the value of "0" and the second state is taken as the value of "1."

In the case where the same value is stored in the two mutually adjacent rotor pairs as illustrated in FIG. 5A, the magnetization directions of the four consecutively-arranged ferromagnet layers are oriented alternately on the 3 o'clock-direction side and the 9 o'clock-direction side. In such a case, the urging of the weak anti-coupling action is satisfied because the magnetization directions are mutually reverse directions for the two mutually adjacent rotors belonging to the two mutually adjacent rotor pairs, i.e., the mutually adjacent ferromagnet layers 13 and 11 having the thick ruthenium layer 14 interposed therebetween. Accordingly, the magnetization directions are substantially the 3 o'clock direction or the 9 o'clock direction; and the urging of the strong anti-coupling action, the urging of the uniaxial anisotropy, and the urging of the weak anti-coupling action do not interfere with each other. In such a case, the magnetization directions substantially cancel each other and a synthesized component of the magnetization directions is substantially zero for the rotor pairs as an entirety.

On the other hand, in the case where mutually different values are stored in the two mutually adjacent rotor pairs as illustrated in FIG. 5B, the magnetization directions of the four consecutively-arranged ferromagnet layers are on, for example, the 3 o'clock-direction side, the 9 o'clock-direction side, the 9 o'clock-direction side, and the 3 o'clock-direction side. At this time, the urging of the weak anti-coupling action is no longer satisfied because the magnetization directions of the two mutually adjacent rotors (the ferromagnet layers) belonging to the two mutually adjacent rotor pairs are on the same side. In such a case, the strong force caused by the strong anti-coupling action, the weak force caused by the weak anti-coupling action, and the force caused by the uniaxial anisotropy balance such that the magnetization directions are directions for which the energy is a minimum. Restated, the state in which the magnetization directions of the two mutually adjacent rotors belonging to the two mutually adjacent rotor pairs are completely opposingly parallel is no longer stable energy-wise.

As a result, the magnetization directions of the two mutually adjacent rotors belonging to the two mutually adjacent rotor pairs, i.e., the mutually adjacent ferromagnet layers 13 and 11 having the thick ruthenium layer 14 interposed therebetween, are on the same side but are oriented in directions slightly twisted away from each other. In such a case, the magnetization directions do not completely cancel and a synthesized component of the magnetization directions occurs for the rotor pairs as an entirety.

A data programming method will now be described.

As illustrated in FIG. 3, magnetic force lines having annular configurations centered on the program word line 31 are generated by providing current to the program word line 31. These magnetic force lines are oriented in a direction perpendicular to the page surface, e.g., the minor-axis direction, at the position of the lowermost-end ferromagnet layer 42. On the other hand, magnetic force lines having annular configurations centered on the bit line 32 are generated by providing current to the bit line 32. These magnetic force lines are oriented in a lateral direction of the page surface, e.g., the major-axis direction, at the position of the lowermost-end ferromagnet layer 42. Thereby, a magnetic field can be applied to the lowermost-end ferromagnet layer 42 in any direction in the plane including the minor-axis direction and the major-axis direction by providing currents having prescribed sizes in prescribed directions to the program word line 31 and the bit line 32. Thus, the magnetization direction of the lowermost-end ferromagnet layer 42 is set to match one of the major-axis directions.

When the magnetization direction of the lowermost-end ferromagnet layer 42 is set, the magnetization direction of the ferromagnet layer of one level thereabove, i.e., the ferromagnet layer 13 of the lowermost level of the shift register 1, is set to a direction reverse to the magnetization direction of the lowermost-end ferromagnet layer 42 due to the strong anti-coupling action via the thin ruthenium layer 12. Thereby, data is programmed to the rotor pair 51 of the lowermost level made of the lowermost-end ferromagnet layer 42 and the ferromagnet layer 13 of the lowermost level of the shift register 1. In other words, the program word line 31 functions as a lower programming interconnect; and the bit line 32 functions as an upper programming interconnect. At this time, because the structures of the program word line 31 and the bit line 32 are yoke structures, pseudo-loops are formed of the lowermost-end ferromagnet layer 42 and the ferromagnet layers 35 having the C-shaped configurations; and the magnetic field can be applied efficiently to the lowermost-end ferromagnet layer 42.

After programming the data to the rotor pair 51 of the lowermost level, the data of the entire shift register 1 is shifted one position upward; and the data programmed to the rotor pair 51 of the lowermost level is moved to the rotor pair 51 of one level thereabove. "Shifting" refers to synchronously moving the data stored in all of the rotor pairs 51 of the shift register 1 in the same direction. The shift method is described below. Then, data is again programmed to the rotor pair 51 of the lowermost level by setting the magnetization direction of the lowermost-end ferromagnet layer 42. This is repeated to program a data column to the shift register 1.

At this time, the direction of the magnetic field applied to the lowermost-end ferromagnet layer 42 to program the data is rotated in a constant rotation direction, e.g., a rotation direction which is clockwise as viewed from above, to a prescribed direction. Thereby, in the two mutually adjacent rotors belonging to the mutually adjacent rotor pairs 51, the magnetization direction of the rotor in which the magnetization direction is previously set, i.e., the rotor of the lower side of the rotor pair 51 of the upper side, is pushed clockwise as viewed from above by the weak force due to the magnetization direction of the rotor in which the magnetization direction is set subsequently, i.e., the rotor of the upper side of the rotor pair of the lower side, to twist clockwise. As a result, the magnetization direction of the rotor of the lower side of the rotor pair 51 of the upper side twists clockwise and the magnetization direction of the rotor of the upper side of the rotor pair 51 of the lower side twists counterclockwise with the major-axis direction as a reference. Therefore, the direction of the "twist" is constant throughout one shift register and is, for example, the direction of a left-handed thread from the bottom upward.

At this time, it is desirable for the same value to be programmed to at least three consecutively-arranged rotor pairs. Thereby, one bit of data is stored using at least three consecutively-arranged rotor pairs.

A data read-out method will now be described.

In the reference layer 36 as illustrated in FIG. 3, the magnetization directions of the iron-nickel alloy layers 38 and 40 are fixed in a state of being opposingly parallel due to the ruthenium layer 39. When the magnetization direction of the iron-nickel alloy layer 40 and the magnetization direction of the lowermost-end ferromagnet layer 42 are the same, the resistance of the tunneling current flowing through the tunneling barrier film 41 is relatively low due to a so-called tunneling magnetoresistance effect; and when the magnetization direction of the iron-nickel alloy layer 40 is reverse to the magnetization direction of the lowermost-end ferromagnet layer 42, the tunneling magnetoresistance flowing through the tunneling barrier film 41 is relatively high. Therefore, the magnetization direction of the lowermost-end ferromagnet layer 42 can be detected and the data of the rotor pair 51 of the lowermost level can be read by evaluating the resistance value of the tunneling barrier film 41. Specifically, the lowermost-end ferromagnet layer 42 is connected to the source line 45 by the via 43 and the selection transistor 44. Therefore, a voltage is applied between the reference layer 36 and the lowermost-end ferromagnet layer 42 by selecting the desired read-out word line 46 to switch the selection transistor 44 to the on-state and then by applying a voltage between the bit line 32 and the source line 45. Then, the size of the tunneling magnetoresistance of the tunneling barrier film 41 can be evaluated by measuring the current value flowing in the bit line 32.

After reading the data of the rotor pair 51 of the lowermost level, the data stored in the shift register 1 is shifted to the level therebelow one level at a time. The shift method is described below. Then, the data of the rotor pair 51 of the lowermost level is read again by detecting the magnetization direction of the lowermost-end ferromagnet layer 42. This is repeated to read the data column stored in the shift register 1.

The data shift method will now be described.

FIG. 6 illustrates simulation results of how one shift register changes over time. In FIG. 6, one rotor pair 51 is illustrated as one ellipse; the magnetization direction $V_{mu}$ of the rotor of the upper side belonging to one rotor pair 51, i.e., the ferromagnet layer 13, is illustrated as a white arrow; and the magnetization direction $V_{ml}$ of the rotor of the lower side, i.e., the ferromagnet layer 11, is illustrated as a black arrow.

At time t=0 as illustrated in FIG. 6, current does not flow in the interconnects 25a and 25b of the rotating force application unit 24 (referring to FIG. 2); and a magnetic field is not applied to the shift register 1. Accordingly, a rotating force is not applied to each of the magnetization directions. At this time, it is taken that the value of "0" is programmed to the consecutively-arranged multiple rotor pairs including the rotor pairs 51a and 51b, the value of "1" is programmed to the consecutively-arranged multiple rotor pairs including the rotor pairs 51c, 51d, and 51e, the value of "0" is programmed to the consecutively-arranged multiple rotor pairs including the rotor pairs 51f and 51g, and the value of "1" is programmed to the consecutively-arranged multiple rotor pairs including a rotor pair 51h. The rotor pair 51b and the rotor pair 51c are adjacent to each other; the rotor pair 51e and the rotor pair 51f are adjacent to each other; and the rotor pair 51g and the rotor pair 51h are adjacent to each other.

In this state as illustrated in FIGS. 7A and 7B, currents are provided to the interconnects 25a and 25b. Thereby, a magnetic field is generated; and the magnetic field is applied uniformly to the multiple shift registers 1 provided in the storage unit 23. Then, as illustrated in FIG. 7C, a magnetic field direction $F_m$ rotates counterclockwise as viewed from above. A rotating force is applied to the magnetization directions $V_m$ of each of the rotor pairs due to the rotation of the magnetic field. The rotating force is a force that urges the magnetization direction $V_m$ of the rotor (the ferromagnet layer) to be oriented in the magnetic field direction $F_m$ generated by the rotating force application unit 24. Accordingly, the direction and the size of the rotating force acting on each of the magnetization directions is different due to the relative relationship between the magnetic field direction $F_m$ and the magnetization direction $V_m$; and the direction of the rotating force inverts when the magnetic field direction $F_m$ overtakes the magnetization direction $V_m$.

The behavior of the rotor pairs can be summarily expressed as follows.

(a) For a rotor pair having a small synthesized component of the magnetization directions, the magnetization direction is substantially not affected even when the direction of the magnetic field rotates because the synthesized component is unresponsive to the magnetic field. Therefore, the magnetization direction does not rotate past the minor-axis direction; and the value of the rotor pair does not change. As described above, a rotor pair having a small synthesized component is a rotor pair programmed with the same value as the rotor pairs adjacent above and below, e.g., the rotor pairs 51a and 51d.

(b) For a rotor pair having a large synthesized component of the magnetization directions, the synthesized component rotates because the synthesized component is sensitive to the magnetic field. Thereby, there are cases where the magnetic field direction rotates past the minor-axis direction and the value changes. As described above, a rotor pair having a large synthesized component is a rotor pair programmed with a value different from that of an adjacent rotor pair. The behavior of the rotor pair having a large synthesized component can be classified summarily into the following two classifications.

(b-1) For a rotor pair positioned on the lower side of the interface where the rotor pairs programmed with mutually different values are mutually adjacent, e.g., the rotor pairs 51c, 51f, and 51h, the magnetization direction $V_{mu}$ of the rotor of the upper side is twisted greatly. As described above, the weak force acts counterclockwise on the magnetization direction $V_{mu}$ of the rotor of the upper side to twist the magnetization direction $V_{mu}$ of the rotor of the upper side counterclockwise with respect to the major-axis direction because the programming of the data is performed by the magnetic field rotating clockwise. Accordingly, when the magnetic field direction $F_m$ rotates counterclockwise to overtake the synthesized component, the magnetization direction $V_{mu}$ of the upper side is overtaken first; and the magnetization direction $V_{ml}$ of the lower side is overtaken subsequently. Also, the rotating force acting on the magnetization direction $V_{mu}$ inverts from clockwise to counterclockwise when the magnetic field direction $F_m$ rotating counterclockwise overtakes the magnetization direction $V_{mu}$ of the upper side.

Therefore, when the magnetization direction $V_{mu}$ of the upper side is overtaken by the magnetic field direction $F_m$, the weak force caused by the weak anti-coupling action and the rotating force are superimposed to act counterclockwise on the magnetization direction $V_{mu}$ of the upper side; this counterclockwise force overcomes the force caused by the uniaxial anisotropy and the strong force acting clockwise; and the magnetization direction $V_{mu}$ of the upper side crosses over the minor-axis direction. When the magnetization direction $V_{mu}$ of the upper side crosses over the minor-axis direction, the magnetization direction $V_{mu}$ of the upper side stabilizes at a direction away from the minor-axis direction because the direction of the force caused by the uniaxial anisotropy acting on the magnetization direction $V_{mu}$ of the upper side flips to counterclockwise. As a result, the strong force acting counterclockwise on the leading magnetization direction $V_{ml}$ of the lower side increases. Further, when the magnetization direction $V_{ml}$ of the lower side is overtaken by the magnetic field direction $F_m$, the rotating force acting on the magnetization direction $V_m$ of the lower side flips to counterclockwise. Thereby, the magnetization direction $V_{ml}$ of the lower side crosses over the minor-axis direction. Thus, the value of the rotor pair changes.

(b-2) Conversely, for a rotor pair positioned on the upper side of the interface where the rotor pairs programmed with mutually different values are mutually adjacent, e.g., the rotor pairs 51b, 51e, and 51g, the magnetization direction $V_{ml}$ of the rotor of the lower side is twisted greatly clockwise. Therefore, when the magnetic field direction $F_m$ rotates counterclockwise to overtake the synthesized component, the magnetization direction $V_{mu}$ of the upper side is overtaken first; and the magnetization direction $V_{ml}$ of the lower side is overtaken subsequently. When the magnetization direction $V_{mu}$ of the upper side is overtaken by the magnetic field direction $F_m$, although the rotating force acts counterclockwise on the magnetization direction $V_{mu}$ of the upper side, the rotating force and the weak force are not superimposed because the weak force does not act on the magnetization direction $V_{mu}$ of the upper side. Therefore, the magnetization direction $V_{mu}$ of the upper side does not cross over the minor-axis direction; and accordingly, the magnetization direction $V_{ml}$ of the lower side does not cross over the minor-axis direction. As a result, the value of the rotor pair does not change.

In the case of (a) described above, the weak force does not occur. Therefore, it can be said that the superimposition of the weak force on the rotating force cannot occur and the magnetization direction does not cross over the minor-axis direction.

How each of the rotor pairs changes over time will now be described specifically.

(1) The rotor pair 51a

At time t=0, the value of "0" is programmed to the rotor pair 51a; and the same value of "0" is programmed also to the rotor pairs adjacent above and below. Therefore, in the rotor pair 51a, the twist of the magnetization direction is small; and the magnetization direction $V_{mu}$ of the rotor of the upper side (the ferromagnet layer 13) is substantially opposingly parallel to the magnetization direction $V_{ml}$ of the rotor of the lower side (the ferromagnet layer 11) along the major-axis direction. In other words, the magnetization direction $V_{mu}$ of the upper side is substantially the 3 o'clock direction; and the magnetization direction $V_{ml}$ of the lower side is substantially the 9 o'clock direction.

In the rotor pair 51a, the synthesized component of the magnetization directions is substantially zero for the entire rotor pair 51a because the magnetization direction $V_{mu}$ and the magnetization direction $V_{ml}$ are substantially opposingly parallel. Also, the strong force caused by the strong anti-coupling action, the weak force caused by the weak anti-coupling action, and the force caused by the uniaxial anisotropy all act to stabilize the opposingly parallel state. Therefore, the weak force does not act to urge the magnetization direction to cross over the minor-axis direction (the 12 o'clock direction and the 6 o'clock direction); and the weak force is not superimposed on the rotating force even when the rotating force acts to urge the magnetization direction to cross over the minor-axis direction. Accordingly, the magnetization direction does not cross over the minor-axis direction; and the value of "0" remains as-is.

(2) The rotor pair 51d

For the rotor pair 51d programmed with the value of "1" as well, the twist of the magnetization direction is small and the magnetization direction $V_{mu}$ of the upper side is substantially opposingly parallel to the magnetization direction $V_{ml}$ of the lower side along the major-axis direction because the same value of "1" is programmed to the rotor pairs thereabove and therebelow. Therefore, the weak force does not act to urge the magnetization direction to cross over the minor-axis direction; and the value of "1" remains as-is.

(3) The rotor pair 51c

Conversely, as described above, the behavior is different for the rotor pair when the rotor pair adjacent thereabove has a different value.

At time t=0 in the rotor pair 51c programmed with the value of "1," the magnetization direction $V_{mu}$ of the upper side of the rotor pair 51c is twisted greatly counterclockwise from the 9 o'clock direction to be oriented in about the 7 o'clock direction due to the weak force acting with the magnetization direction $V_{ml}$ of the lower side of the rotor pair 51b adjacent thereabove because the rotor pair 51b has the value of "0." On the other hand, although the weak force does not act on the magnetization direction $V_{ml}$ of the lower side of the rotor pair 51c, the magnetization direction $V_{ml}$ of the lower side of the rotor pair 51c is oriented in about the 2 o'clock direction due to the strong force acting with the magnetization direction $V_{mu}$ of the upper side of the rotor pair 51c. Therefore, the magnetization direction $V_{mu}$ of the upper side of the rotor pair 51c is not completely opposingly parallel to the magnetization direction $V_{ml}$ of the lower side; and a synthesized component of the magnetization directions occurs in about the 4 o'clock direction.

At time t=1, a magnetic field is applied to urge the magnetization direction to be oriented in the 6 o'clock direction. Thereby, a rotating force acts counterclockwise on the magnetization direction $V_{mu}$ of the upper side of the rotor pair 51c; and the magnetization direction $V_{mu}$ of the upper side of the rotor pair 51c approaches the 6 o'clock direction. On the other hand, although a rotating force acts clockwise on the magnetization direction $V_{ml}$ of the lower side of the rotor pair 51c, the counterclockwise strong force due to the rotation of the magnetization direction $V_{mu}$ of the upper side of the rotor pair 51c increases. Therefore, these forces cancel; and the magnetization direction $V_{ml}$ of the lower side does not change very much. As a result, the synthesized component of the magnetization directions increases further. At this time, for the magnetization direction $V_{mu}$ of the upper side of the rotor pair 51c, the rotating force and the weak force act counterclockwise; and the strong force and the force caused by the uniaxial anisotropy act clockwise. On the other hand, for the magnetization direction $V_{ml}$ of the lower side of the rotor pair 51c, the strong force acts counterclockwise; and the rotating force and the force caused by the uniaxial anisotropy act clockwise.

At time t=2, a magnetic field is applied to urge the magnetization direction to be oriented in the 3 o'clock direction. Thereby, the counterclockwise rotating force acting on the magnetization direction $V_{mu}$ of the upper side increases further and is superimposed on the weak force; and the magnetization direction $V_{mu}$ of the upper side crosses over the 6 o'clock direction. Once the magnetization direction $V_{mu}$ of the upper side crosses over the 6 o'clock direction, only the strong force acts clockwise because the force caused by the uniaxial anisotropy acts in a direction reverse to the direction up to that time, i.e., counterclockwise. As a result, the magnetization direction $V_{mu}$ of the upper side stabilizes at about the 5 o'clock direction. On the other hand, for the magnetization direction $V_{ml}$ of the lower side of the rotor pair 51c, the strong force increases because of the rotation of the magnetization direction $V_{mu}$ of the upper side; and the magnetization direction $V_{ml}$ of the lower side is pushed back slightly counterclockwise. As a result, the magnetization direction $V_{ml}$ of the lower side stabilizes at about the 1 o'clock direction. At this time, in the rotor pair 51c, the value is no longer "1" because both of the magnetization directions $V_{mu}$ and $V_{ml}$ are oriented on the 3 o'clock-direction side.

At time t=3, a magnetic field is applied to urge the magnetization direction to be oriented in the 12 o'clock direction. When the direction of the magnetic field overtakes the magnetization direction $V_{ml}$ of the lower side, the rotating force acting on the magnetization direction $V_{ml}$ of the lower side flips to counterclockwise. Also, the strong force acting counterclockwise on the magnetization direction $V_{ml}$ of the lower side increases because the magnetization direction $V_{mu}$ of the upper side rotates counterclockwise. As a result, the magnetization direction $V_{ml}$ of the lower side crosses over the 12 o'clock direction. Once the magnetization direction crosses over the 12 o'clock direction, although the rotating force flips to clockwise, the force caused by the uniaxial anisotropy flips to counterclockwise; and the magnetization direction $V_{mu}$ of the upper side stabilizes at about the 11 o'clock direction. Thereby, the value of the rotor pair 51*c* becomes "0."

At time t=4, a magnetic field is applied to urge the magnetization direction to be oriented in the 9 o'clock direction. Thereby, the rotating force acts counterclockwise on the magnetization direction $V_{ml}$ of the lower side of the rotor pair 51*c*; and the magnetization direction $V_{ml}$ of the lower side stabilizes at about the 10 o'clock direction. On the other hand, for the magnetization direction $V_{mu}$ of the upper side of the rotor pair 51*c*, the rotating force does not act very much because the direction of the magnetic field is substantially the reverse direction. Therefore, the magnetization direction $V_{mu}$ of the upper side does not change very much and remains as-is at about the 4 o'clock direction. Thereby, in the rotor pair 51*c*, the magnetization direction $V_{mu}$ of the upper side is substantially opposingly parallel to the magnetization direction $V_{ml}$ of the lower side; and the synthesized component is reduced. Therefore, even when the magnetic field rotates thereafter, the magnetization direction of the rotor pair 51*c* is no longer affected very much; and the value does not change. Thus, the value of the rotor pair 51*c* is switched from "1" to "0" by one rotation of the magnetic field. The operations of the rotor pair 51*h* also are similar.

(4) The rotor pair 51*f*

At time t=0, the value of "0" is programmed to the rotor pair 51*f* and the value of "1" is programmed to the rotor pair 51*e* adjacent thereabove. Therefore, the magnetization direction $V_{mu}$ of the upper side of the rotor pair 51*f* is twisted greatly counterclockwise from the 3 o'clock direction to about the 1 o'clock direction due to the weak force acting with the magnetization direction $V_{ml}$ of the lower side of the rotor pair 51*e*. On the other hand, although the weak force does not act on the magnetization direction $V_{ml}$ of the lower side of the rotor pair 51*f*, the strong force acts; and the magnetization direction $V_{ml}$ of the lower side of the rotor pair 51*f* is about the 8 o'clock direction. Therefore, the magnetization direction $V_{mu}$ of the upper side of the rotor pair 51*f* is not completely opposingly parallel to the magnetization direction $V_{ml}$ of the lower side; and a synthesized component of the magnetization directions occurs.

At time t=1 and time t=2, the rotating force acts in a direction to reduce the synthesized component because the rotating force is oriented toward the side reverse to the synthesized component of the rotor pair 51*f*; and the magnetization direction $V_{mu}$ of the upper side and the magnetization direction $V_{ml}$ of the lower side do not change very much.

At time t=3, a magnetic field is applied to urge the magnetization direction to be oriented in the 12 o'clock direction. Thereby, the direction of the magnetic field overtakes the magnetization direction $V_{mu}$ of the upper side; and a counterclockwise rotating force acts on the magnetization direction $V_{mu}$ of the upper side. Also, the weak force acts on the magnetization direction $V_{mu}$ of the upper side. On the other hand, although a clockwise rotating force is applied to the magnetization direction $V_{ml}$ of the lower side, the counterclockwise strong force increases due to the rotation of the magnetization direction $V_{mu}$ of the upper side. Therefore, these forces cancel; and the magnetization direction $V_{ml}$ of the lower side remains as-is at about the 8 o'clock direction.

At time t=4, a magnetic field is applied to urge the magnetization direction to be oriented in the 9 o'clock direction. As a result, the rotating force acting counterclockwise on the magnetization direction $V_{mu}$ of the upper side increases; and the magnetization direction $V_{mu}$ of the upper side crosses over the 12 o'clock direction. Thereby, the direction of the force caused by the uniaxial anisotropy acting on the magnetization direction $V_{mu}$ of the upper side inverts to counterclockwise. As a result, the rotating force and the force caused by the uniaxial anisotropy act counterclockwise on the magnetization direction $V_{mu}$ of the upper side of the rotor pair 51*f*; the strong force acts clockwise; and the magnetization direction $V_{mu}$ of the upper side of the rotor pair 51*f* stabilizes at about the 11 o'clock direction. On the other hand, the magnetization direction $V_{ml}$ of the lower side of the rotor pair 51*f* is pushed counterclockwise by the magnetization direction $V_{mu}$ of the upper side to about the 7 o'clock direction. As a result, in the rotor pair 51*f*, both the magnetization directions $V_{mu}$ and $V_{ml}$ are oriented on the 9 o'clock-direction side; and the value is no longer "0."

At time t=5, a magnetic field is applied to urge the magnetization direction to be oriented in the 6 o'clock direction. Thereby, the direction of the magnetic field overtakes the magnetization direction $V_{ml}$ of the lower side; and a counterclockwise rotating force acts on the magnetization direction $V_{ml}$ of the lower side. The rotating force acts counterclockwise also on the magnetization direction $V_{mu}$ of the upper side; and the magnetization direction $V_{mu}$ of the upper side rotates counterclockwise. Thereby, the counterclockwise strong force acting on the magnetization direction $V_{ml}$ of the lower side increases. As a result, the magnetization direction $V_{ml}$ of the lower side rotates counterclockwise to cross over the 6 o'clock direction. Thereby, the force caused by the uniaxial anisotropy acts counterclockwise; and the magnetization direction $V_{ml}$ of the lower side stabilizes at the 5 o'clock direction. As a result, the magnetization direction $V_{mu}$ of the upper side is on the 9 o'clock-direction side; the magnetization direction $V_{ml}$ of the lower side is on the 3 o'clock-direction side; and therefore the value of the rotor pair 51*f* becomes "1."

At time t=6, the magnetic field vanishes. Thereby, the rotating force vanishes; and although the magnetization direction $V_{ml}$ of the lower side of the rotor pair 51*f* rotates slightly counterclockwise, the value of the rotor pair 51*f* does not change. Thus, the value of the rotor pair 51*f* is switched from "0" to "1" by one rotation of the magnetic field.

(5) The rotor pair 51*b*

At time t=0, the value of "0" is programmed to the rotor pair 51*b*. The value of "1" is programmed to the rotor pair 51*c* adjacent therebelow. Therefore, the magnetization direction $V_{ml}$ of the lower side of the rotor pair 51*b* is twisted greatly clockwise from the 9 o'clock direction to about the 11 o'clock direction due to the weak force acting with the magnetization direction $V_{mu}$ of the upper side of the rotor pair 51*c*. On the other hand, although the weak force does not act on the magnetization direction $V_{mu}$ of the upper side of the rotor pair 51*b*, the magnetization direction $V_{mu}$ of the upper side of the rotor pair 51*b* twists slightly clockwise from the 3 o'clock direction to about the 4 o'clock direction accompanying the twist of the magnetization direction $V_{ml}$ of the lower side of the rotor pair 51b. Therefore, the magnetization direction $V_{mu}$ of the upper side of the rotor pair 51b is not completely opposingly parallel to the magnetization direction $V_{ml}$ of the lower side; and a synthesized component of the magnetization directions occurs.

At time t=1, a rotating force acts counterclockwise on the magnetization direction $V_{ml}$ of the lower side of the rotor pair 51b; and the magnetization direction $V_{ml}$ of the lower side of the rotor pair 51b changes to about the 10 o'clock direction.

At time t=2, a magnetic field is applied in a direction to urge the magnetization direction to be oriented in the 3 o'clock direction; and the magnetization direction $V_{mu}$ of the upper side is about the 3 o'clock direction. At this time, although the magnetic field direction $F_m$ overtakes the magnetization direction $V_{mu}$ of the upper side, the weak force is not superimposed on the rotating force and the magnetization direction $V_{mu}$ of the upper side does not change greatly because the weak force does not act on the magnetization direction $V_{mu}$ of the upper side.

From time t=3 and thereafter, the weak force no longer acts on the magnetization direction $V_{ml}$ of the lower side as well and the magnetization direction has almost no change because the value of the rotor pair 51c adjacent therebelow is "0."

Thus, the value of the rotor pair 51b does not change even when the direction of the magnetic field rotates. Rotor pairs 51g and 51e also are similar.

The operations recited above can be summarized as follows. When a magnetic field rotating counterclockwise is applied to the shift register 1 programmed with data by a magnetic field rotating clockwise, the values of the rotor pairs (e.g., the rotor pairs 51a and 51d) programmed with the same value as the rotor pairs adjacent above and below do not change; the values are switched when the rotor pairs (e.g., the rotor pairs 51c, 51f, and 51h) are positioned on the lower side of an interface at which the values switch; and the values of the rotor pairs (e.g., the rotor pairs 51b, 51e, and 51g) positioned on the upper side of the interface do not change. Thereby, the data column is shifted one position downward, i.e., toward the program/read element 22.

By a similar principle, when a magnetic field rotating clockwise is applied to the shift register 1 programmed with data by a magnetic field rotating clockwise, the values of the rotor pairs programmed with the same value as the rotor pairs adjacent above and below do not change; the values of the rotor pairs positioned on the lower side of an interface at which the values switch also do not change; and the values of the rotor pairs positioned on the upper side of the interface are switched. Thereby, the data column is shifted one position upward, i.e., in the direction away from the program/read element 22. Thus, the data column can be shifted in the forward and reverse directions. Similarly, when a magnetic field rotating clockwise is applied to a shift register programmed with data by a magnetic field rotating counterclockwise, the data column is shifted downward, i.e., toward the program/read element 22. Conversely, when a magnetic field rotating counterclockwise is applied, the data column is shifted upward, i.e., in the direction away from the program/read element 22.

By programming the same value to three consecutively-arranged rotor pairs, a distinct discrimination is possible between the rotor pair programmed with the same value as the rotor pairs adjacent above and below, between the rotor pair positioned on the upper side of the interface, and between the rotor pair positioned on the lower side of the interface; and the shift operations described above can be implemented reliably.

Effects of this embodiment will now be described.

The program/read element 22 and the storage unit 23 are provided separately in the shift register memory device 21 according to this embodiment. Thereby, in the storage unit 23, the storage elements, i.e., the rotor pairs, can be integrated with high density. As a result, the storage capacity per unit surface area can be increased; and the cost per bit can be reduced. In particular, in this embodiment, the storage elements can be arranged three-dimensionally because the multiple shift registers 1 are arranged in a matrix configuration; and the effect of increasing the bit density of the storage elements is particularly large.

In this embodiment, a rotating magnetic field can be applied uniformly to the entire shift register 1 by providing current to the interconnects 25a and 25b of the rotating force application unit 24. As a result, the data column programmed to the shift register 1 can be synchronously shifted accurately. Therefore, the shift register memory device 21 according to this embodiment has high reliability when shifting the data. In particular, magnetic fields are more transmissive than electric fields; and magnetic fields are not easily shielded. Therefore, the fluctuation of the magnetic field by location is small and stable operations can be realized even when the magnetic field is applied to the entire array made of the multiple shift registers arranged in a matrix configuration.

It is also conceivable to use a method that provides a pulse current to the shift register itself to push the data out. However, in such a case, when increasing the physical length of the shift register to increase the capacity of the shift register, the parasitic capacitance and the parasitic inductance of the shift register also increase. Therefore, the waveform of the pulse current becomes unresponsive; and the possibility of misoperations undesirably increases. Conversely, this embodiment does not use a statistical phenomenon as the principle of the shift operation and uses a transition that seeks points at which the free energy is a minimum. Therefore, a shift register having few mis-shifts and high reliability can be realized even in the case where the shift register is lengthened such that the number of positions is, for example, several kilo-positions.

Further, the reliability is high for the repeated operations of programming and reading in the shift register memory device according to this embodiment because there are no mechanically operating portions.

According to this embodiment, the shift register 1 can be easily constructed by alternately stacking an iron-nickel alloy layer and a ruthenium layer. The rotating force can be easily applied to the rotors of the shift register 1 by providing the two interconnects 25a and 25b and providing current to these interconnects.

Although an example is illustrated in this embodiment in which the rotating force application unit 24 is disposed above the storage unit 23, i.e., on the side opposite to the program/read element 22, the invention is not limited thereto. The rotating force application unit 24 may be disposed below the storage unit 23. Further, although not-illustrated, as a method of applying the rotating force more effectively with a small current, it is also possible to use a structure in which the interconnect 25a and the interconnect 25b are provided in the lower portion of the shift register column and the top and bottom of the shift register column are enclosed with a helical configuration as in a solenoid coil. Thereby, it is possible to shift the data with a smaller current; and low-power operations of the shift register memory device are possible. The interconnects 25a and 25b of the rotating force application unit 24 may have yoke structures. One rotating force application unit may be provided for one shift register 1 instead of providing one rotating force application unit 24 for the entire storage unit 23.

Although an example is illustrated in this embodiment in which different strengths of the anti-coupling action are provided by using two levels of the thickness of the ruthenium layer, the invention is not limited thereto. For example, a layer made of a material other than ruthenium may be provided instead of the thick ruthenium layer 14. In such a case, the thickness of the layer may be the same as that of the thin ruthenium layer 12. Further, although an example is illustrated in this embodiment in which the ruthenium layer is provided between the ferromagnet layers, the invention is not limited thereto. For example, a rhenium layer may be provided instead of the ruthenium layer.

Furthermore, although an example is illustrated in this embodiment in which data are programmed to the shift register by controlling the rotate with a current magnetic field, data may be programmed to the shift register by controlling the rotate with a spin torque transfer. A first variation of this embodiment will now be described.

Figure 8:
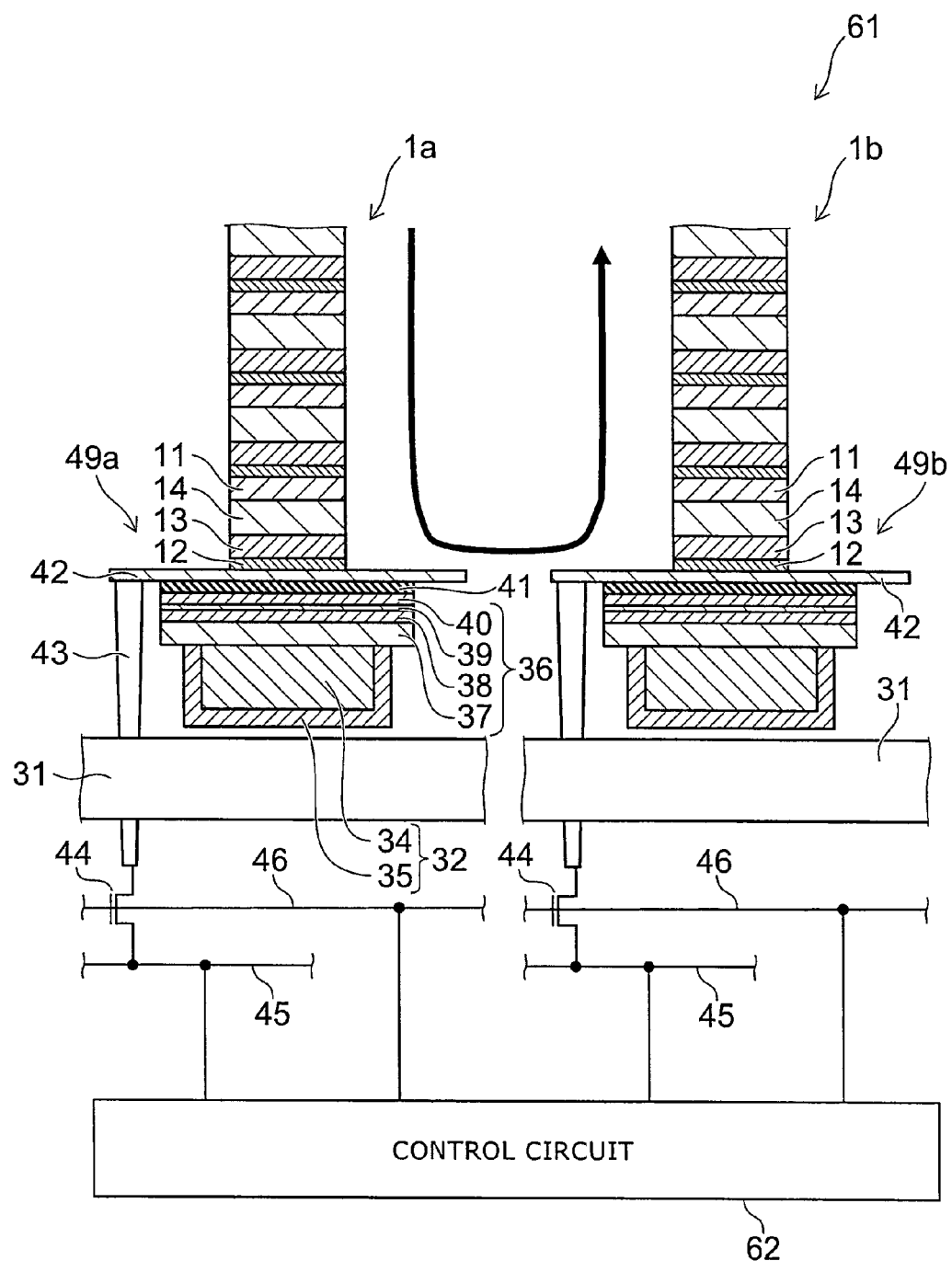
FIG. 8 is a cross-sectional view illustrating a shift register memory device according to a first variation of the first embodiment.

FIG. 8 is a cross-sectional view illustrating a shift register memory device according to this variation.

In the shift register memory device 61 according to this variation as illustrated in FIG. 8, at least two shift registers 1a and 1b are provided in the storage unit 23; and at least two program/read units 49a and 49b are provided in the program/read element 22. The lower end of the shift register 1a is connected to the lowermost-end ferromagnet layer 42 of the program/read unit 49a; and the lower end of the shift register 1b is connected to the lowermost-end ferromagnet layer 42 of the program/read unit 49b. A control circuit 62 is provided and connected to the program word line 31, the bit line 32, the source line 45, and the read-out word line 46. The configurations of the shift registers 1a and 1b and the program/read units 49a and 49b are similar to the respective configurations of the shift register 1 and the program/read unit 49 of the first embodiment described above. Thus, in this variation, the lower ends of the pair of shift registers are connected to each other to realize a pseudo U-shaped shift register.

In the shift register memory device 61 according to this variation, the control circuit 62 drives the program/read unit 49a to read the data column programmed to the shift register 1a and drives the program/read unit 49b to program the data column to the shift register 1b. The program/read units 49a and 49b program data to the shift registers 1a and 1b using magnetic fields rotating in mutually reverse directions. Thereby, when the same rotating magnetic field is applied by the rotating force application unit 24 (referring to FIG. 2), the data columns are shifted downward in the shift register 1a and upward in the shift register 1b.

When the data column programmed to the shift register 1a is read by being shifted to the position of the program/read unit 49a, the data column is undesirably erased from the shift register 1a. Therefore, an external buffer memory is necessary to temporarily store the data column. Therefore, in this variation, the data column read from the shift register 1a is programmed to the shift register 1b. Thereby, the buffer memory for storing the data column is unnecessary. Therefore, the circuit surface area can be reduced; and the cost of the shift register memory device 61 can be reduced. Otherwise, the configuration, operations, and effects of this variation are similar to those of the first embodiment described above.

A second variation of this embodiment will now be described.

Figure 9:
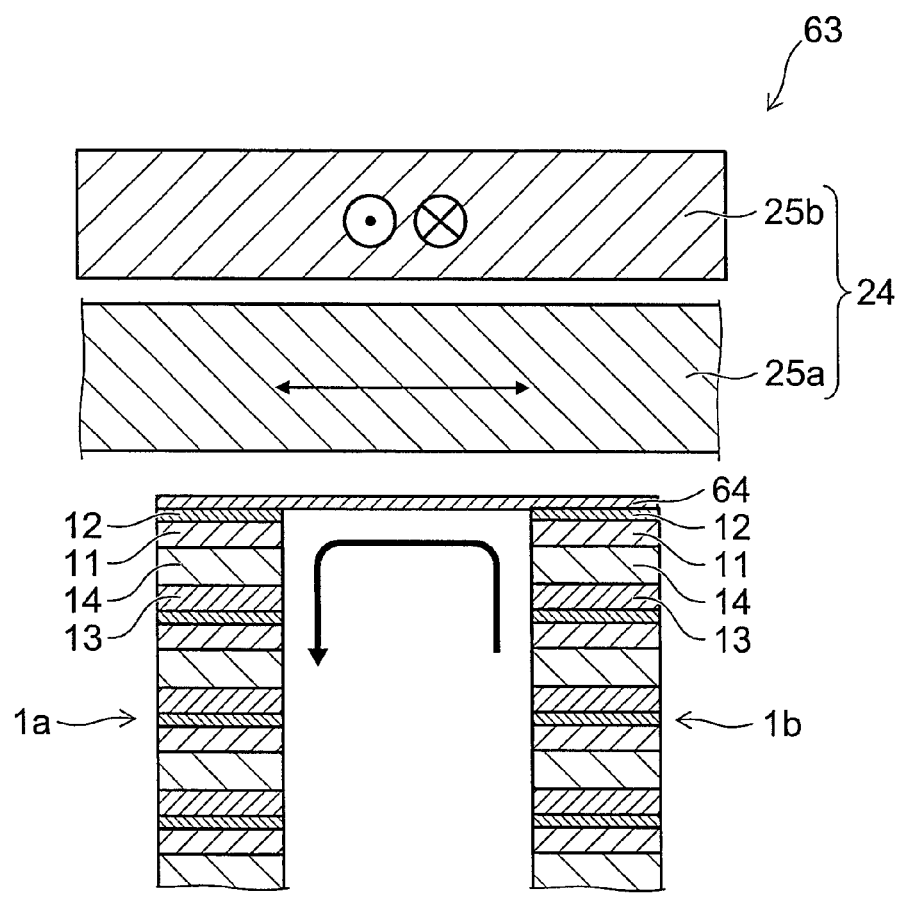
FIG. 9 is a cross-sectional view illustrating a shift register memory device according to a second variation of the first embodiment.

FIG. 9 is a cross-sectional view illustrating the shift register memory device according to this variation.

In the shift register memory device 63 according to this variation as illustrated in FIG. 9, a ferromagnet layer 64 is provided in connection with both of the thin ruthenium layer 12 of the uppermost layer of the shift register 1a and the thin ruthenium layer 12 of the uppermost layer of the shift register 1b in addition to the configuration of the shift register memory device 61 according to the first variation described above (referring to FIG. 8).

According to this variation, the rotor pairs of the uppermost layers of the shift registers 1a and 1b can be linked by the shift registers 1a and 1b sharing the ferromagnet layer 64 as the rotors of the uppermost layers. Thereby, the data shifted upward through the shift register 1b to reach the rotor pair of the uppermost portion is reproduced in the rotor pair of the uppermost portion of the shift register 1a and is shifted downward through the shift register 1a. Thereby, the two shift registers 1a and 1b can be used by being connected in a pseudo-loop configuration.

In the first variation described above, only one shift register of data can be programmed to the two shift registers to ensure space for moving the data column. Conversely, according to this variation, two shift registers of data can be programmed to the two shift registers because the data reaching the upper end of the shift register 1b can be moved in open space created in the upper portion of the shift register 1a. As a result, the effective storage capacity can be increased. Further, when accessing the desired data, the time to access the data can be reduced because the data column can be shifted in the more proximal direction of the forward and reverse directions; and even faster operations are possible. Otherwise, the configuration, operations, and effects of this variation are similar to those of the first variation described above.

A third variation of this embodiment will now be described.

Figure 10:
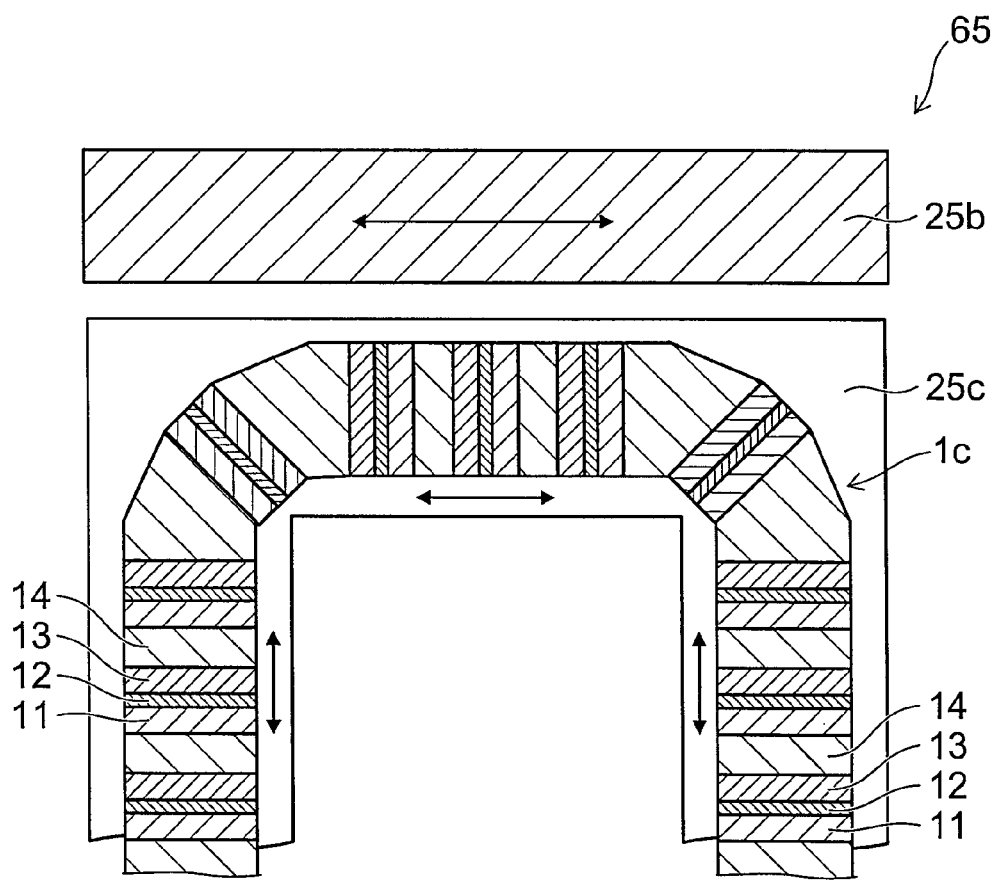
FIG. 10 is a cross-sectional view illustrating a shift register memory device according to a third variation of the first embodiment.

FIG. 10 is a cross-sectional view illustrating a shift register memory device according to this variation.

As illustrated in FIG. 10, the shift register memory device 65 according to this variation differs from the shift register memory device 61 (referring to FIG. 8) according to the first variation described above in that a shift register 1c having a U-shaped configuration is provided instead of the shift registers 1a and 1b (referring to FIG. 8). Also, an interconnect 25c having a U-shaped configuration conforming to the shift register 1c is provided instead of the interconnect 25a (referring to FIG. 8). The end portions of the shift register 1c are connected to the program/read units 49a and 49b respectively. According to this variation as well, similarly to the second variation described above, the effective storage capacity can be increased by connecting the shift register in a pseudo-loop configuration. Otherwise, the configuration, operations, and effects of this variation are similar to those of the first variation described above.

A second embodiment of the invention will now be described.

Figure 11:
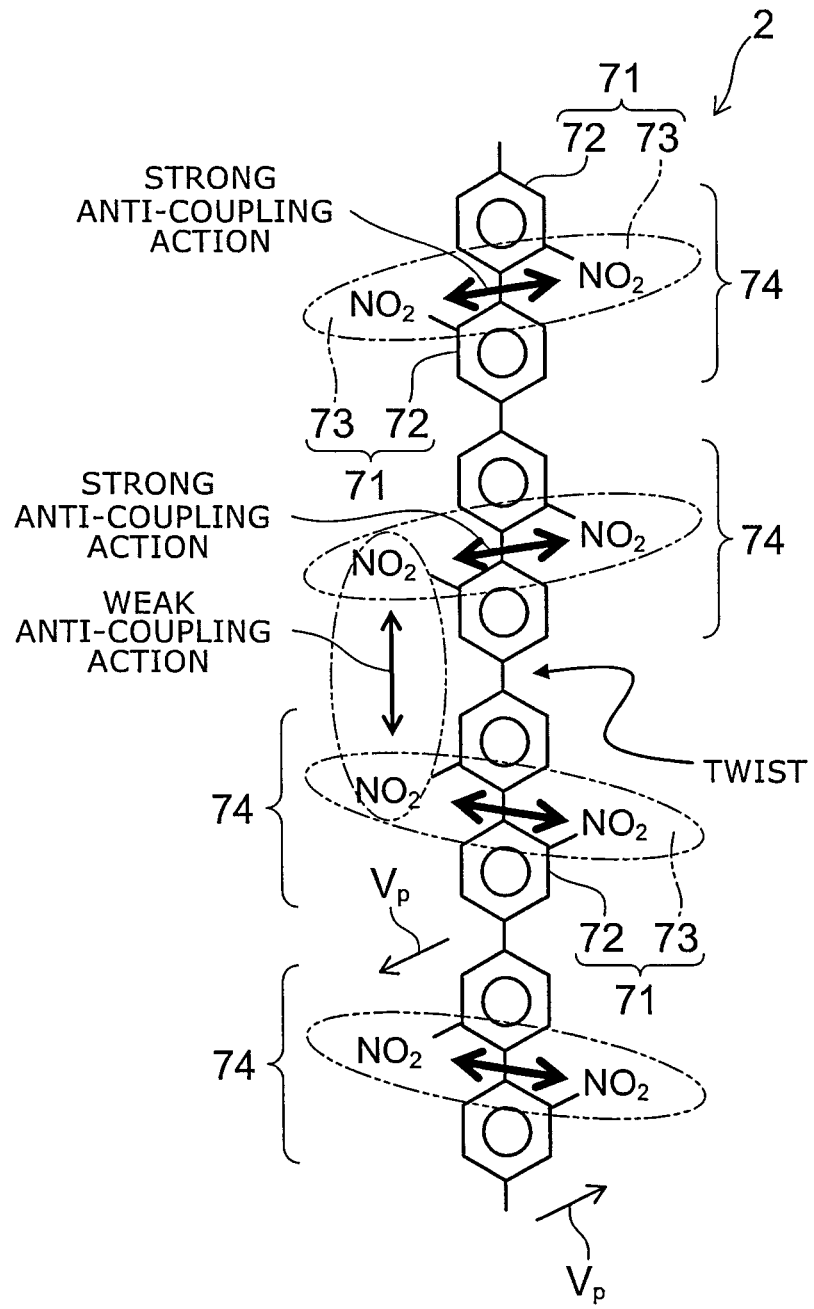
FIG. 11 illustrates a shift register according to a second embodiment.

FIG. 11 illustrates a shift register according to this embodiment.

This embodiment differs from the first embodiment described above in that the shift register includes a polymer in which polar molecules are polymerized in a straight chain configuration instead of the stacked body of the ferromagnet layers, the rotor is a polar molecule instead of the ferromagnet layer, the rotatable characteristic direction is a polar direction of the polar molecule instead of the magnetization direction of the ferromagnet layer, the anti-coupling action occurs due to an electric force (a Coulomb force) instead of the magnetic force, and the rotating force occurs due to the rotation of an electric field instead of the magnetic field.

A specific example will now be described.

As illustrated in FIG. 11, the shift register 2 according to this embodiment includes a nitrobenzene polymer. In the nitrobenzene polymer, numerous nitrobenzene molecules 71 are polymerized in a straight chain configuration along one direction (hereinbelow referred to as the "polymerization direction"). In each of the nitrobenzene molecules, one nitro group (a —$NO_2$ group) 73 is bonded to one benzene ring 72. In the nitrobenzene polymer, a nitrobenzene molecule 71 in which the nitro group 73 is bonded on one polymerization-direction side (referred to as the "lower side" for convenience) is arranged alternately with a nitrobenzene molecule 71 in which the nitro group 73 is bonded on one other polymerization-direction side (referred to as the "upper side" for convenience). The benzene rings 72 are rotatably bonded to each other by pi bonds. Accordingly, each of the nitrobenzene molecules 71 is rotatable with respect to the nitrobenzene molecules 71 thereabove and therebelow with an axis extending in the polymerization direction as the rotational axis.

Because the benzene ring 72 is an electron donating group and the nitro group 73 is an electron withdrawing group, the nitrobenzene molecule 71 is a polar molecule and is a monomer having a dipole moment. In the shift register 2, the nitrobenzene molecule 71 which is a polar molecule is taken to be the rotor; and a polar direction $V_p$ from the positive pole of the nitrobenzene molecule 71, i.e., the benzene ring 72, toward the negative pole, i.e., the nitro group 73, is taken to be the characteristic direction of each of the rotors (the nitrobenzene molecules). In other words, the nitrobenzene molecule 71 which is the rotor is arranged along the polymerization direction; and the characteristic direction (the polar direction $V_p$) thereof rotates due to the nitrobenzene molecule 71 being rotated.

The crystal structure of the nitrobenzene polymer included in the shift register 2 is oriented. Thereby, the nitrobenzene molecule 71 included in each of the rotors is provided with uniaxial anisotropy. The crystal structure of the nitrobenzene polymer can be oriented by, for example, bundling the multiple nitrobenzene polymers and performing annealing under an electric field when manufacturing the shift register. As a result, the polar direction $V_p$ of the nitrobenzene molecule 71 is easily oriented in one selected from two mutually opposite directions orthogonal to the polymerization direction. Hereinbelow, these two directions are referred to as the "major-axis directions" for convenience. The direction orthogonal to both the polymerization direction and the major-axis direction is referred to as the "minor-axis direction." Thus, in each of the nitrobenzene molecules, the uniaxial anisotropy acts to urge the polar direction to be oriented in one selected from the major-axis directions; and a force caused by the uniaxial anisotropy acts.

Because the nitro group 73 is negatively charged, a Coulomb force (a repulsion force) acts between the mutually adjacent nitrobenzene molecules 71 to urge the nitro groups 73 to separate from each other. In the nitrobenzene polymer included in the shift register 2, the distance between the nitro groups 73 is not constant because the nitrobenzene molecule 71 in which the nitro group 73 is bonded on the lower side of the benzene ring 72 is arranged alternately with the nitrobenzene molecule 71 in which the nitro group 73 is bonded on the upper side of the benzene ring 72. As a result, this repulsion force is classified into two types.

A strong anti-coupling action that urges the polar directions to be opposingly parallel occurs between the nitrobenzene molecules 71 having mutually proximal nitro groups 73, that is, between two nitrobenzene molecules 71 of a pair made of two mutually adjacent nitrobenzene molecules 71 in which the molecule having the nitro group 73 bonded on the lower side of the benzene ring 72 is disposed above and the molecule having the nitro group 73 bonded on the upper side of the benzene ring 72 is disposed below. As a result, a strong force (a first force) acts between the nitrobenzene molecules 71 to urge the polar directions to be opposingly parallel. Thereby, the multiple nitrobenzene molecules belonging to the shift register 2 are organized into multiple rotor pairs 74 of every two adjacent nitrobenzene molecules having mutually proximal nitro groups.

On the other hand, a weak anti-coupling action that urges the polar directions to be opposingly parallel occurs between the nitrobenzene molecules 71 having mutually distal nitro groups 73, that is, between two nitrobenzene molecules 71 of a pair made of two mutually adjacent nitrobenzene molecules 71 in which the molecule having the nitro group 73 bonded on the lower side of the benzene ring 72 is disposed below and the molecule having the nitro group 73 bonded on the upper side of the benzene ring 72 is disposed above. As a result, a weak force (a second force) urging the polar directions to be opposingly parallel acts on the two mutually adjacent nitrobenzene molecules 71 (rotors) belonging to the mutually adjacent rotor pairs 74. The distance between the centroids of the two mutually adjacent nitrobenzene molecules 71 belonging to the mutually adjacent rotor pairs 74 is greater than the distance between the centroids of the two nitrobenzene molecules 71 belonging to the same rotor pair 74; and the distance between the nitro groups 73 of the former is less than the distance between the nitro groups 73 of the latter. Therefore, the strong force described above (the first force) is stronger than the weak force (the second force).

Thus, in this embodiment, similarly to the first embodiment described above, the uniaxial anisotropy, the strong anti-coupling action, and the weak anti-coupling action affect each of the rotors (the nitrobenzene molecules); and the force caused by the uniaxial anisotropy, the strong force, and the weak force act on each of the rotors. In addition to such internal forces, external forces may be applied to each of the rotors from outside the shift register 2. Similarly to the first embodiment described above, the external forces may include a rotating force to urge the characteristic direction (the polar direction) to rotate and a force for programming the data. However, this embodiment differs from the first embodiment in that such external forces are applied by causing an electric field to rotate instead of a magnetic field. These are described below.

It is preferred that an intensity of the "weak force" (the second force) is about 0.9 times of an intensity of the "strong force" (the first force). This makes a margin expand in the shift action mentioned later. And even when the intensity of a rotation electric field varies, the shift action can be stabilized.

A shift register memory device according to this embodiment will now be described.

Figure 12:
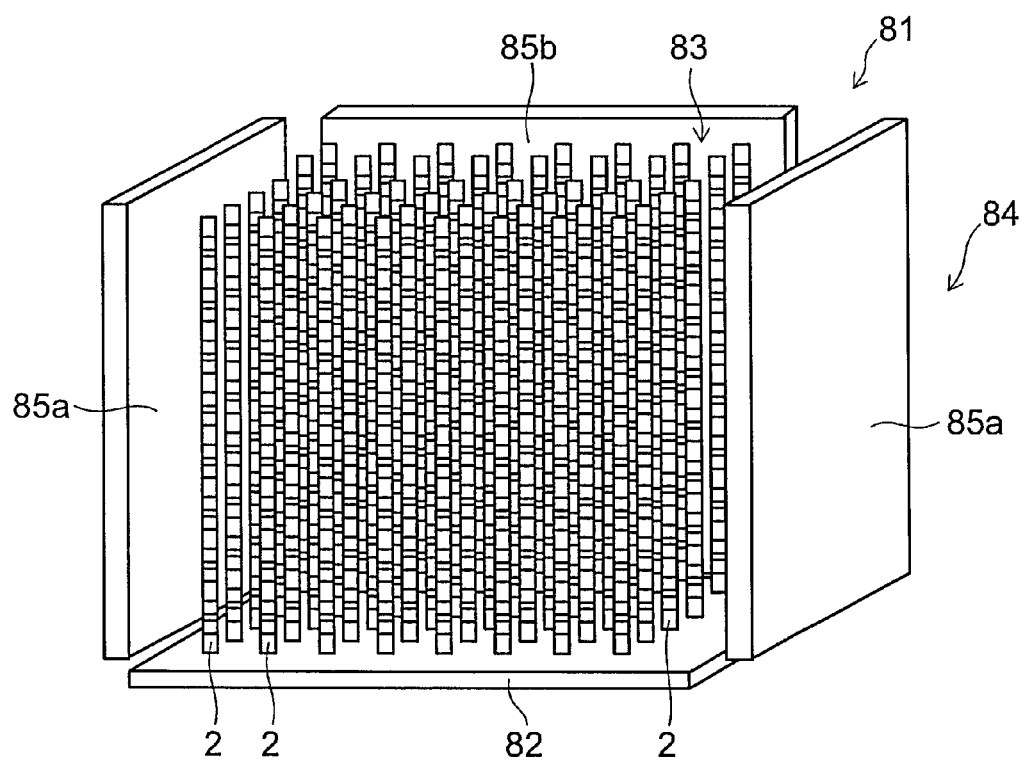
FIG. 12 is a perspective view illustrating a shift register memory device according to the second embodiment.

FIG. 12 is a perspective view illustrating the shift register memory device according to this embodiment.

Figure 13:
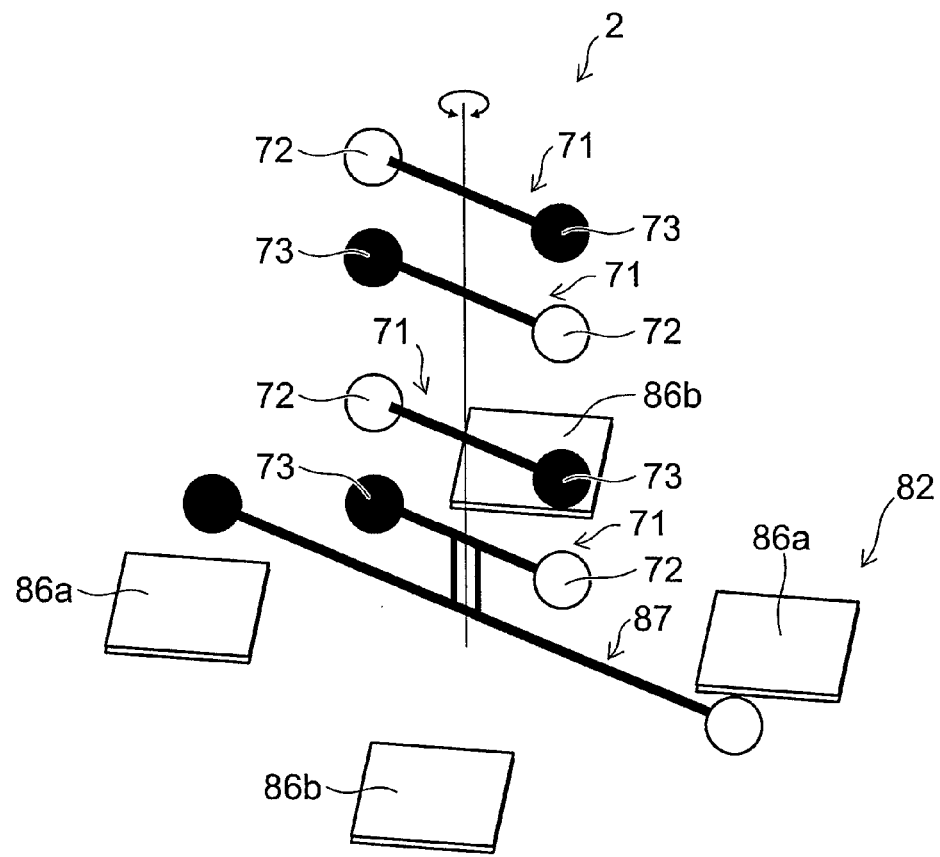
FIG. 13 is a perspective view illustrating a program/read element of the shift register memory device according to the second embodiment.

FIG. 13 is a perspective view illustrating the program/read element of the shift register memory device according to this embodiment.

To simplify FIG. 13, the monomer of polar nitrobenzene is schematically illustrated as an electric dipole in which a white ball and a black ball having positive and negative charges are linked together. This is similar for FIG. 14 described below.

In the shift register memory device 81 according to this embodiment as illustrated in FIG. 12, a program/read element 82 is provided; and a storage unit 83 and a rotating force application unit 84 are provided thereon.

In the storage unit 83, the shift register 2 described above is multiply provided and arranged in a matrix configuration. Each of the shift registers 2 extends in the vertical direction. In other words, the polymerization direction of the shift register 2 matches the vertical direction of the shift register memory device 81. The major-axis directions of the shift registers 2 match each other. Although the shift registers 2 are isolated from each other, the lower end of each of the shift registers 2 is connected to the program/read element 82.

The rotating force application unit 84 includes two pairs of electrode plates 85a and 85b disposed on sides of the storage unit 83. In FIG. 12, one of the electrode plates 85b is not illustrated. The pair of electrode plates 85a is disposed on the two major-axis-direction sides as viewed from storage unit 83 to oppose each other with the storage unit 83 interposed therebetween. The pair of electrode plates 85b is disposed on two minor-axis-direction sides as viewed from the storage unit 83 to oppose each other with the storage unit 83 interposed therebetween. The rotating force application unit 84 is commonly provided for the multiple shift registers 2 belonging to the storage unit 83.

In the program/read element 82 as illustrated in FIG. 13, two pairs of control electrodes 86a and 86b are provided for every shift register 2. The pair of control electrodes 86a is disposed on two major-axis-direction sides as viewed from shift register 2. The other pair of control electrodes 86b is disposed on two minor-axis-direction sides as viewed from the shift register 2. A rotating dipole 87 is bonded to the lower end of the shift register 2. The rotating dipole 87 is, for example, a polar molecule having a molecular radius greater than the molecular radius of the nitrobenzene molecule 71. The polar direction of the rotating dipole 87 is fixed with respect to the polar direction of the nitrobenzene molecule 71 included in the lowermost portion of the shift register 2.

Operations of the shift register memory device 81 according to this embodiment formed as described above, that is, a method for using the shift register 2 according to this embodiment, that is, a data storage method according to this embodiment, will now be described.

Figure 14:
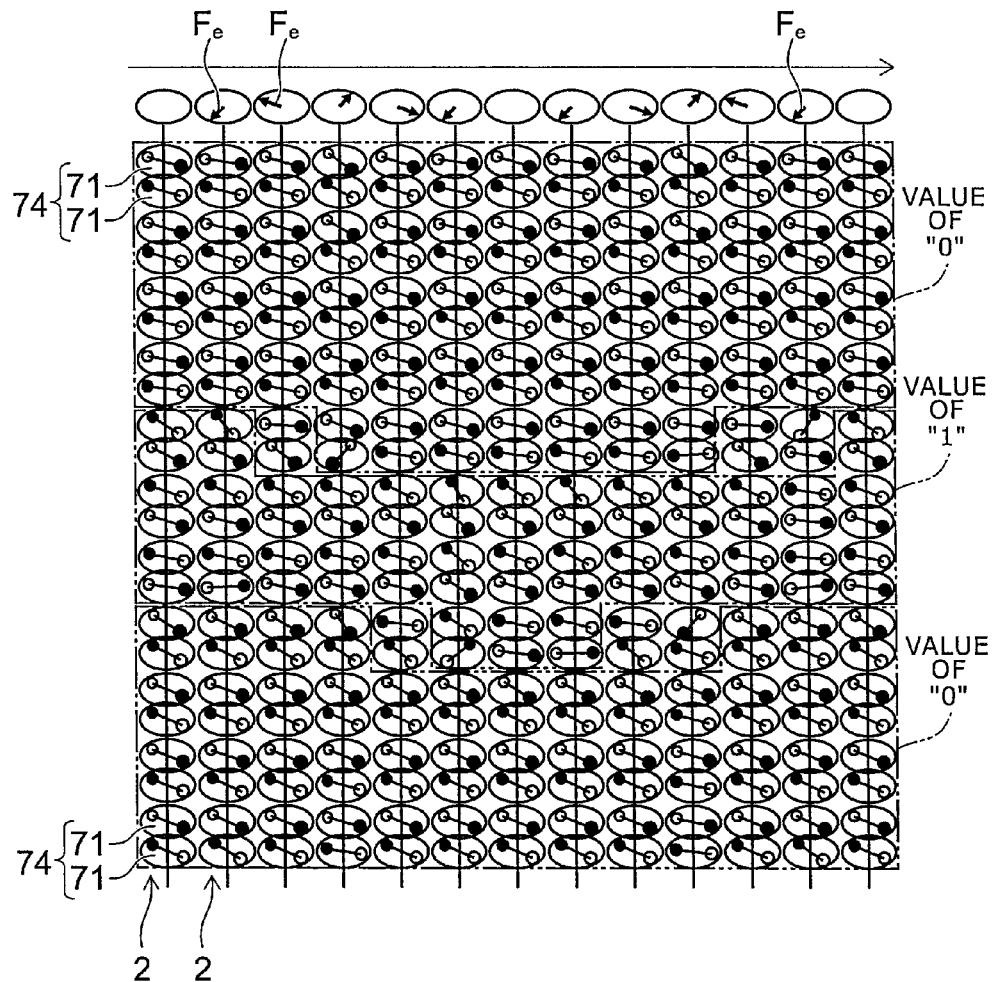
FIG. 14 illustrates a data shift method of the second embodiment.

FIG. 14 illustrates the data shift method of this embodiment.

In the nitrobenzene polymer included in the shift register as described above, the nitrobenzene molecules 71 are arranged in one column along the polymerization direction as the rotors; and each of the nitrobenzene molecules 71 is rotatable with an axis extending in the polymerization direction as the rotational axis. Similarly to the first embodiment described above, the force caused by the uniaxial anisotropy, the strong force, and the weak force act on each of the rotors. Therefore, similarly to the first embodiment (referring to FIGS. 4A and 4B) described above, each of the rotor pairs 74 can have two states in a static state in which external forces are not applied. That is, each of the rotor pairs 74 can have a first state, in which the polar direction of the rotor of the upper side, i.e., the nitrobenzene molecule in which the nitro group is bonded on the lower side of the benzene ring, is on the 3 o'clock-direction side and the polar direction of the rotor of the lower side, i.e., the nitrobenzene molecule in which the nitro group is bonded on the upper side of the benzene ring, is on the 9 o'clock-direction side, and a second state, in which the polar direction of the rotor of the upper side is on the 9 o'clock-direction side and the polar direction of the rotor of the lower side is on the 3 o'clock-direction side. Thereby, the two values of "0" and "1" are storable in each of the rotor pairs 74.

Similarly to the first embodiment described above, in the case where different values are programmed to mutually adjacent rotor pairs, "twisting" occurs in the polar directions of the two mutually adjacent rotors belonging to the mutually adjacent rotor pairs respectively. In other words, as illustrated in FIG. 5A, in the case where the same value is stored in the two mutually adjacent rotor pairs, the polar direction of each of the rotors is substantially the 3 o'clock direction or substantially the 9 o'clock direction and the synthesized component thereof is substantially zero to satisfy all of the urgings of the uniaxial anisotropy, the strong anti-coupling action, and the weak anti-coupling action. On the other hand, as illustrated in FIG. 5B, in the case where different values are stored in the two mutually adjacent rotor pairs, the urging of the weak anti-coupling action is no longer satisfied because the polar directions of the two mutually adjacent rotors belonging to the two mutually adjacent rotor pairs are on the same side. In such a case, the polar directions stabilize at directions for which the forces balance and the energy is a minimum. In other words, the polar directions of the two mutually adjacent rotors belonging to the two mutually adjacent rotor pairs are on the same side but are oriented in directions slightly twisted away from each other. Thereby, a synthesized component of the polar directions occurs for the rotor pairs as an entirety.

The data programming method will now be described.

As illustrated in FIG. 13, a Coulomb force is caused to act on the rotating dipole 87 by applying a voltage between the control electrodes 86a and between the control electrodes 86b of the program/read element 82; and the polar direction of the rotating dipole 87 is set to the 3 o'clock direction or the 9 o'clock direction. Thereby, the polar direction of the nitrobenzene molecule 71 of the lowermost level of the shift register 2 is set to the same direction as that of the rotating dipole 87. When the polar direction of the nitrobenzene molecule 71 of the lowermost level is set, the polar direction of the nitrobenzene molecule 71 of one level thereabove is set to a direction reverse to the polar direction of the nitrobenzene molecule 71 of the lowermost end. Thereby, data is programmed to the rotor pair 74 of the lowermost level.

Then, a data column is programmed to the shift register 2 by alternately repeating programming the data to the rotor pair 74 of the lowermost level and shifting the data upward. At this time, the direction of the electric field applied to the rotating dipole 87 to program the data is rotated in a constant rotation direction, e.g., a rotation direction which is clockwise as viewed from above, to a prescribed direction. Thereby, in the two mutually adjacent rotors belonging to the mutually adjacent rotor pairs 74, the polar direction of the previously-set rotor is pushed clockwise by the subsequently-set rotor. As a result, the polar direction of the rotor of the lower side of the rotor pair 74 of the upper side twists clockwise and the polar direction of the rotor of the upper side of the rotor pair 74 of the lower side twists counterclockwise with the major-axis direction as a reference. At this time, the same value is then programmed to at least three consecutively-arranged rotor pairs. For example, one bit of data is stored using the three consecutively-arranged rotor pairs.

The data read-out method will now be described.

When the polar direction of the nitrobenzene molecule 71 of the lowermost level of the shift register 2 is oriented in some direction, the polar direction of the rotating dipole 87 also is oriented in the same direction. Thereby, a prescribed charge is induced in the control electrodes 86a and 86b. Therefore, the polar direction of the nitrobenzene molecule 71 of the lowermost level can be detected by measuring the potential or the amount of charge of the control electrodes 86a and 86b; and the data programmed to the rotor pair 74 of the lowermost level can be read. Then, by alternately repeating the reading of the data from the rotor pair 74 of the lowermost level and the shifting of the data downward, the data column is read from the shift register 2.

The data shift method will now be described.

FIG. 14 illustrates simulation results of how one shift register changes over time. In FIG. 14, one rotor (the nitrobenzene molecule 71) is illustrated as one ellipse; and one rotor pair 74 is illustrated as two ellipses contacting each other.

Similarly to FIG. 13, the monomer of polar nitrobenzene is schematically illustrated as an electric dipole in which a white ball and a black ball having positive and negative charges are linked together.

In this embodiment, an electric field rotating with respect to the storage unit 83 is applied by applying a voltage that changes dynamically between the electrode plates 85a and between the electrode plates 85b of the rotating force application unit 84. A rotating force is applied to each of the rotors by the rotating electric field acting on each of the rotors (the polar molecules) of each of the shift registers 2. As a result, the data column can be shifted upward or downward by a principle similar to that of the first embodiment described above.

In other words, as illustrated in FIG. 14, the data column can be moved one position downward by one clockwise rotation of the electric field direction $F_e$. The data column can be moved one position upward by one counterclockwise rotation of the electric field direction $F_e$. This utilizes the fact that the "twist" described above exists and the rotor pair, in which the dipole moments of the two rotors do not cancel each other, reacts particularly sensitively to an electric field.

According to this embodiment, a shift register operating by a principle similar to that of the first embodiment described above can be realized by the shift register including a rotor due to a rotating dipole due to a polar monomer such as a nitrobenzene molecule. In this embodiment, a shift register memory having a higher number of positions can be realized with a fewer number of processes by utilizing the structure of a polymer as the rotor. A stable data retention characteristic with respect to quantum-mechanical fluctuations such as thermal agitation is provided because the information is maintained by the rotation of a molecule (the monomer) having an actual mass. Otherwise, the configuration, operations, and effects of this embodiment are similar to those of the first embodiment described above.

Although an example is illustrated in this embodiment in which a nitrobenzene polymer, in which a nitro group used as an electron withdrawing group is bonded to a benzene ring used as an electron donating group, is used as the shift register, the invention is not limited thereto. In addition to the nitro group, for example, a cyano group, a tosyl group, a mesyl group, a phenyl group, an acyl group, a halogen, etc., can be used as the electron withdrawing group. The shift register may include a polymer having a straight chain configuration including an electron donating group and may include a polymer having a straight chain configuration including both an electron donating group and an electron withdrawing group. For example, a methoxy group, an amino group, a methylamino group, a methyl group, etc., can be used as the electron donating group. Further, it is not always necessary for the polymer to include a benzene ring.

Although an example is illustrated in the shift register according to this embodiment in which the distances between the nitro groups have two levels and the anti-coupling actions have two levels of strength, i.e., the strong anti-coupling action and the weak anti-coupling action, because the nitrobenzene molecule in which the nitro group is bonded on the lower side of the benzene ring is arranged alternately with the nitrobenzene molecule in which the nitro group is bonded on the upper side of the benzene ring, the invention is not limited thereto. For example, even in the case where the electron withdrawing group or the electron donating group is positioned at the center of the rotor, different strengths of the anti-coupling action can be provided as long as the straight chain is formed such that the distance between the rotors is asymmetrical.

Further, although an example is illustrated in this embodiment in which the electric field is applied collectively by the two pairs of electrode plates 85a and 85b to all of the multiple shift registers 2 belonging to the storage unit 83, the invention is not limited thereto. A structure may be used in which electrode plates are provided for every block having one shift register or multiple bundled and crystallized shift registers to enclose the block as if with a sheath. Thereby, the electric field can be applied reliably to each of the shift registers.

This embodiment also can realize variations similar to the first to third variations of the first embodiment described above.

The superordinate concepts of the first and second embodiments described above can be described as follows.

The shift register includes multiple rotors arranged along one direction. Each of the rotors has a characteristic direction rotatable around a rotational axis extending in the one direction. Uniaxial anisotropy is provided to the rotors; and the rotors have a tendency to be oriented in either of one direction (the major-axis direction) orthogonal to the one direction. The rotors are organized into multiple rotor pairs of every two mutually adjacent rotors; a strong force (a first force) acts to urge the characteristic directions to be opposingly parallel for the two rotors belonging to the same rotor pair; and a weak force (a second force) acts to urge the characteristic directions to be opposingly parallel for the two mutually adjacent rotors belonging to the mutually adjacent rotor pairs.

In addition to the shift register described above, the shift register memory device includes a program/read element and a rotating force application unit. The program/read element programs data to the shift register by rotating the characteristic direction of the rotor disposed in the one end portion of the shift register, for example, clockwise to cause the characteristic direction to match one selected from two directions conforming to the uniaxial anisotropy. The program/read element reads the data by detecting the characteristic direction of the rotor disposed in the one end portion. The rotating force application unit shifts the data column in a direction away from the one end portion by applying a rotating force to the shift register to urge the characteristic direction to rotate clockwise. The data column is shifted in the direction toward the one end portion by the rotating force being applied to the shift register to urge the characteristic direction to rotate counterclockwise.

An example is illustrated in the first embodiment described above in which the rotor is taken to be a ferromagnet layer, the characteristic direction is taken to be a magnetization direction of the ferromagnet layer, and the rotating force is taken to occur by a magnetic field being rotated; and an example is illustrated in the second embodiment described above in which the rotor is taken to be a polar molecule, the characteristic direction is taken to be a direction from the positive pole of the polar molecule toward the negative pole, and the rotating force is taken to occur by an electric field being rotated. However, the invention is not limited thereto. For example, the rotor may be a micro object in which the rotor itself mechanically rotates; and the characteristic direction may be a longitudinal direction of the micro object. Or, the rotor may be mechanically fixed; and an anisotropy of a property thereof may be rotated.

Although an example is illustrated in the first and second embodiments described above in which each of the shift registers singularly stores the prescribed data column, the invention is not limited thereto. Multiple, and desirably three or more, shift registers may be bundled and used; and these multiple shift registers may store the same data column.

Thereby, redundancy can be provided to the shift register memory device to increase the reliability.

Although an example is illustrated in the first and second embodiments described above in which three positions are used as one bit, the invention is not limited thereto. For example, it is also possible to represent information using the number of consecutive positions having the same value. For example, the case of 3 consecutive positions having the same value may be taken as the value of "00," the case of 4 consecutive positions having the same value may be taken as the value of "01," the case of 5 consecutive positions having the same value may be taken as the value of "10," and the case of 6 consecutive positions having the same value may be taken as the value of "11."

Although an example is illustrated in the first and second embodiments described above in which the rotor pair made of the two rotors operates as the basic unit, three or more rotors may operate as the basic unit.

Although an example is illustrated in the first and second embodiments described above in which "weak force" (the second force) is weaker than the "strong force" (the first force), the invention is not limited thereto, the intensity of the second force may be equal to the intensity of the first force. As mentioned above, when the second force is weaker than the first force, the shift action can be stabilized. Therefore, from a point of stability of operation, it is preferred that the intensity of the second force is weaker than the intensity of the first force, more preferred that the intensity of the second force is about 0.9 times of the intensity of the first force.

Although, when the second force is equal to the first force, the structure of a shift register can be simplified. For example, in the first embodiment, thickness of the ruthenium layer 12 and thickness of the ruthenium layer 14 can be made equal. Moreover, in the second embodiment, the molecule of simple structure, that is the polar molecules whose bonding position of a polar group are same, are arranged like a straight chain can be used as a shift register, rather than not the polymer by which the polar molecule which is two kinds of polar molecules whose bonding position of a polar group differs are arranged alternately. Therefore, in order to simplify the structure of a shift register, it is preferred that the intensity of the second force is equal to the intensity of the first force.

According to the embodiments of the invention described above, a shift register, a shift register memory device, and a data storage method having high reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A shift register device, comprising:
a shift register including a plurality of basic units repeatedly arranged along a first direction, each of the basic units including lamination in order of a first ferromagnetic layer, a first buffer layer, a second ferromagnetic layer, and a second buffer layer; and
a magnetic field application unit configured to apply a magnetic field to the shift register, a direction of the magnetic field intersecting with the first direction,
wherein the first buffer layer is thinner than the second buffer layer.

2. The device according to claim 1, wherein:
the first buffer layer is formed of a different material from the second buffer layer.

3. The device according to claim 1, wherein:
the first and second ferromagnetic layers have a configuration extending along a second direction as viewed from the first direction.

4. The device according to claim 1, wherein:
the first and second ferromagnetic layers have an ellipse, an oval, a diamond shape, a rectangle in cross section perpendicular to the first direction.

5. The device according to claim 1, wherein:
the basic units further include a third ferromagnetic layer or more ferromagnetic layers.

6. The device according to claim 1, wherein:
the magnetic field application unit is configured to apply the magnetic field to a plurality of the shift registers.

7. A shift register memory device, comprising:
a shift register including a plurality of basic units repeatedly arranged along a first direction, each of the basic units including lamination in order of a first ferromagnetic layer, a first buffer layer, a second ferromagnetic layer, and a second buffer layer;
a magnetic field application unit configured to apply a magnetic field to the shift register, a direction of the magnetic field intersecting with the first direction; and
a program/read element configured to program data to the shift register and configured to read the data in the shift register,
wherein the first buffer layer is thinner than the second buffer layer.

8. The device according to claim 7, wherein:
the first buffer layer is formed of a different material from the second buffer layer.

9. The device according to claim 7, wherein:
the first and second ferromagnetic layers have a configuration extending along a second direction as viewed from the first direction.

10. The device according to claim 7, wherein:
the first and second ferromagnetic layers have an ellipse, an oval, a diamond shape, a rectangle in cross section perpendicular to the first direction.

11. The device according to claim 7, wherein:
the basic units further include a third ferromagnetic layer or more ferromagnetic layers.

12. The device according to claim 7, wherein:
the magnetic field application unit is configured to apply the magnetic field to a plurality of the shift registers.

13. The device according to claim 7, further comprising:
a control circuit configured to control the program/read element and formed below the shift register.

14. The device according to claim 7, wherein:
the program/read element is configured to program the data to the shift register by using a spin torque transfer.

15. The device according to claim 7, further comprising:
a control circuit configured to control the program/read element,
the program/read element having:
two ferromagnetic layers with fixed magnetization directions in anti-parallel;
and
a tunnel barrier layer provided between the shift register and the two ferromagnetic layers;

the control circuit evaluating a tunneling magnetoresistance of the tunnel barrier layer during reading operation.

16. The device according to claim 7, wherein:
ends of pair of the shift registers are connected to each other.

17. The device according to claim 7, wherein:
the shift register has U-shaped configuration.

18. The device according to claim 17, further comprising:
an interconnect provided along the shift register and having U-shaped configuration.

* * * * *